United States Patent [19]

Iwahashi

[11] 4,445,203

[45] Apr. 24, 1984

[54] MEMORY DEVICE

[75] Inventor: Hiroshi Iwahashi, Yokohama, Japan

[73] Assignee: Tokyo Shibaura Denki Kabushiki Kaisha, Japan

[21] Appl. No.: 304,036

[22] Filed: Sep. 21, 1981

[30] Foreign Application Priority Data

Sep. 25, 1980 [JP] Japan .............................. 55-133559

[51] Int. Cl.³ .............................................. G11C 11/40
[52] U.S. Cl. ..................................... 365/189; 365/205
[58] Field of Search ............... 365/174, 189, 190, 202, 365/203, 205, 207; 307/530, 350, 360, 362

[56] References Cited

U.S. PATENT DOCUMENTS 3,953,839  4/1976  Dennison et al. .................... 365/154
4,094,008  6/1978  Lockwood et al. ................. 365/149
4,123,799  10/1978 Peterson ............................. 365/205
4,134,151  1/1979  O'Connell et al. ................. 365/189

Primary Examiner—Joseph A. Popek

Attorney, Agent, or Firm—Finnegan, Henderson, Farabow, Garrett & Dunner

[57] ABSTRACT

A memory device has memory cells for storing binary data, a data line coupled to the memory cells for transferring data stored in the memory cells, a decoder for selecting one of the memory cells to couple the selected memory cell with the data line, the potential of the data line being changed with the stored data of the selected memory cell, and a sense amplifier coupled to the data line for sensing the stored data of the selected memory cell and providing an output corresponding to the sensed stored data. The sense amplifier includes a sensor responsive to a first threshold level and a second threshold level for providing the output such that, when the data line potential crosses the first threshold level, the sensor provides an output representing the first stored data and when the data line potential crosses the second threshold level, the sensor provides an output representing second stored data.

20 Claims, 54 Drawing Figures

F I G. 7
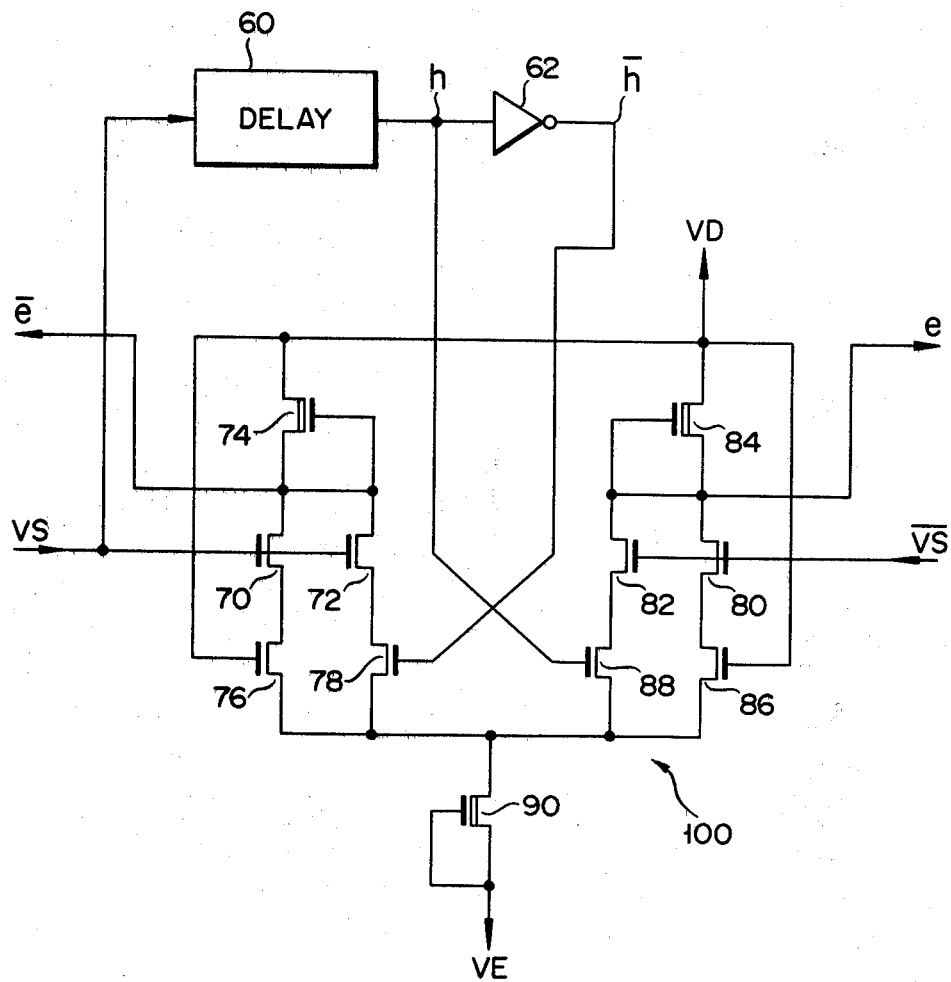

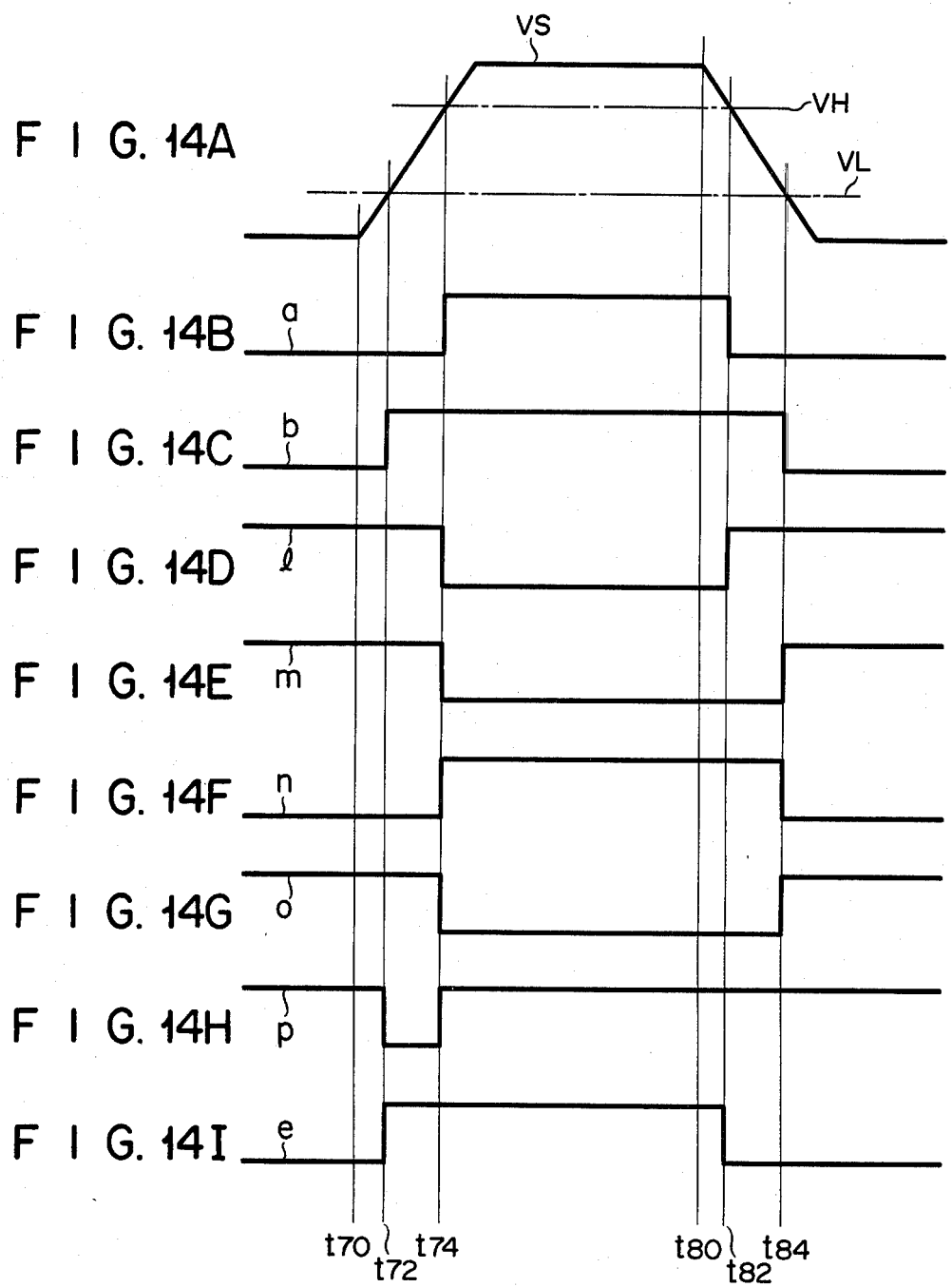

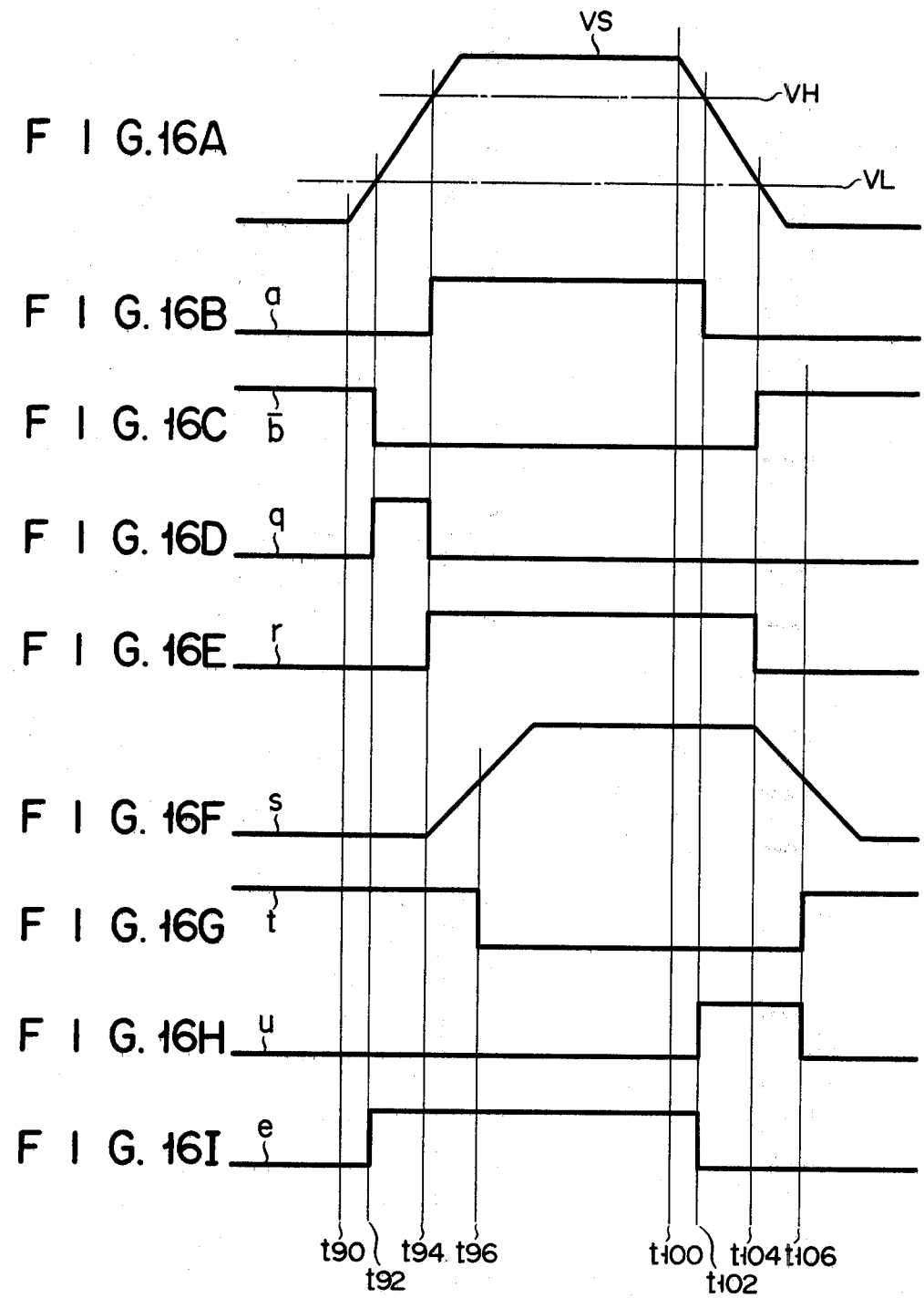

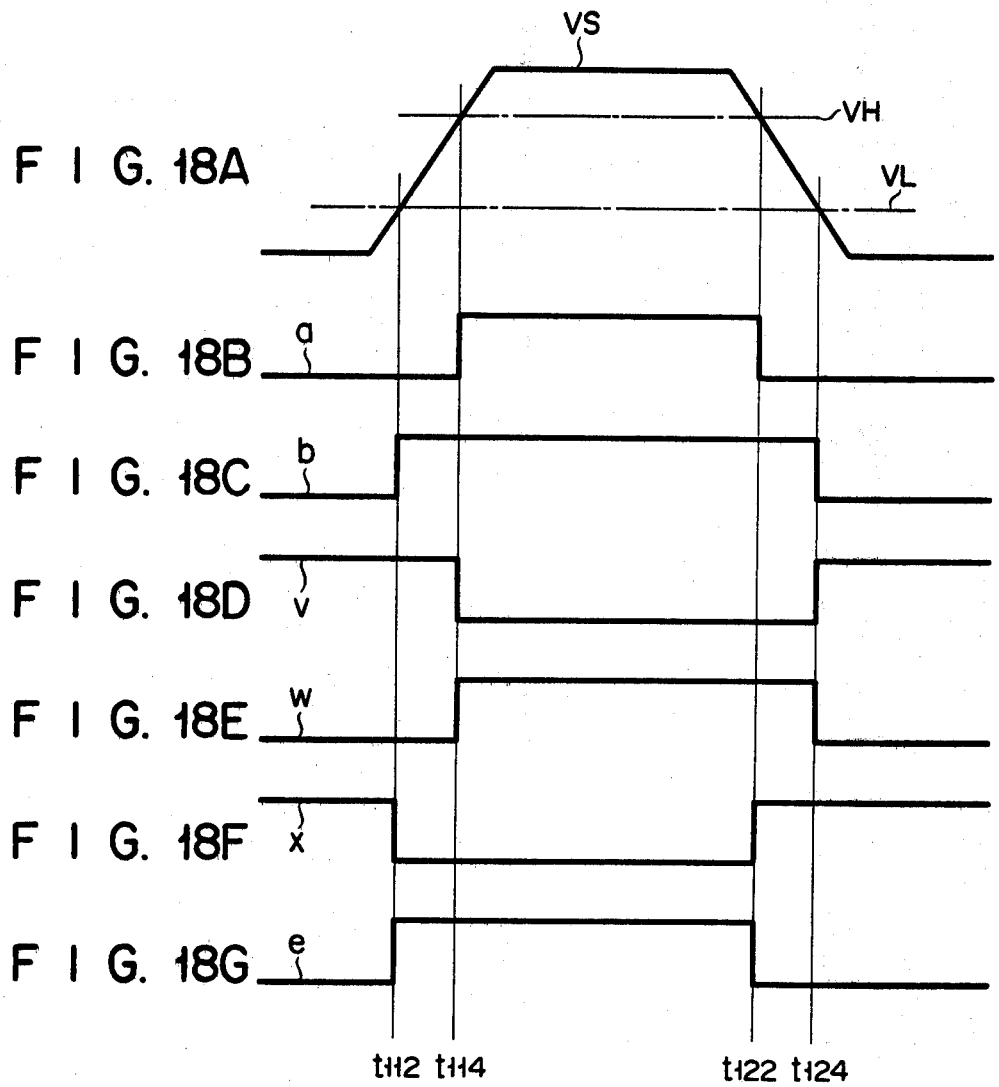

MEMORY DEVICE

BACKGROUND OF THE INVENTION

The present invention relates to a memory device with an improved sense amplifier.

Semiconductor IC memories are widely used. Typical examples of this type of memories are a read only memory (ROM) and a random access memory (RAM). The readout of stored data from the ROM or the RAM is performed by a sense amplifier. There is yet room for improvement on the readout speed of the stored data by a prior art sense amplifier.

FIG. 1 shows a configuration of a general semiconductor read only memory (ROM). Illustrated in the figure are a column decoder 1, column lines (data lines) 2, column selecting MOS transistors 3, a row decoder 4, row lines (word lines) 5, MOS transistors 6 forming memory cells each of which is driven by the corresponding line 5, a load MOS transistor 7 for charging the lines 2, and a sense amplifier 8 with an output buffer. The transistors 3 and 6 are of the enhancement type. The transistor 7 is of the depletion type.

The operation of the ROM will be described. First a given column selecting transistor 3 is driven by the decoder 1 to select a corresponding data line 2 connected with the transistor 3. Second, a given word line 5 is selected by the row decoder 4. A memory cell transistor 6 provided at a cross point of the selected lines 2 and 5 is driven by the selected line 5. The selected line 2 and a sensing point S are discharged (an ON state of the transistor 6) or charged (an OFF state of the transistor 6) in accordance with the stored data (represented by ON or OFF state) of the selected transistor 6. The charging operation is performed by a power supply potential E through the load transistor 7. The stored data of the selected transistor 6 corresponds to a potential of the selected line 2. The sense amplifier 8 connected to the sensing point S senses the potential of the selected line 2. The stored data sensed by the amplifier 8 is read out through the output buffer in the amplifier 8.

The stored data of the memory cell transistor 6 is determined depending on whether or not a drain (or a source) of the transistor 6 is connected to the data line 2. Assume now that the decoders 1 and 4 select a specific transistor 6 with its drain connected to the data line 2. On this assumption, the charge stored in the capacitances of the selected line 2 and the sensing point S are discharged by way of a drain-source path of the selected transistor 6. When a selected transistor 6 with the drain unconnected to the data line 2 (in a cutoff state) is selected, the selected line 2 and the sensing point S are charged by the potential E via the transistor 7. The sense amplifier 8 detects either of two states of the data line 2, i.e., charge or discharged state of the data line 2, and outputs either logic 0 or logic 1, whichever is the stored data.

FIG. 2 shows a simple equivalent circuit for illustrating the charge and discharge of either data line 2 shown in FIG. 1. In FIG. 2, resistance R7 represents an internal resistance of the load transistor 7. Resistance R6 is representative of a conduction resistance of the memory cell transistor 6. The symbols R6 and R7 are also used to indicate equivalent resistors for providing the corresponding resistances. Switches S3 and S6 represent ON and OFF functions of the transistors 3 and 6, respectively. A capacitance C indicates a total capacitance of the data line 2 and the sensing point S. In this example, the conduction resistance of the transistor 3 is much smaller than the resistance R7 and therefore is neglected. Alternately, it may be considered that the resistance R7 includes the conduction resistance of the transistor 3.

FIG. 3 shows time varying curves of a charged voltage VC or a sense potential VS of the capacitance C shown in FIG. 2. Before time t10, the switch S3 is ON, while the switch S6 is OFF, and the line 2 is charged up to the power supply potential E. At time t10, when a memory cell transistor 6 having the stored data of logic 0 is selected by the row decoder 4, the switch S6 is ON. Then, the line 2 is discharged to a dividend potential $\{R6/(R6+R7)\}$ E, or a minimum potential Ed, by the resistances R6 and R7. When, at a time t20, a memory cell transistor with its stored data of logic 1 is selected, the switch S6 is OFF. Then, the line 2 is charged up to the maximum potential E.

A threshold level VTH for distinguishing logic 0 from logic 1 and vice versa is set midway between the potentials E and Ed. The stored data "logic 0" is sensed when the sense potential VS is less than the level VTH. The stored data "logic 1" is sensed when the sense potential VS is more than the level VTH. Accordingly, the read out time of the logic 0 is TL1, and the read out time of the logic 1 is TH1.

In FIG. 3, the resistance R7 of a broken curve as plotted is larger than that of a solid curve. As the resistance R7 is larger, the minimum potential Ed is lower and the read out time TL2 of the logic 0 is shorter (TL2<TL1). When the resistance R7 becomes larger, however, a time constant C×R7 of the resistance R7 and the capacitance C is larger, so that the read out time TH2 of the logic 1 becomes longer (TH2>TH1). Conversely, when the resistance R7 is made small in order to shorten the read out time TH2, the read out time TL2 is elongated. If both the resistances R6 and R7 are made small, both the read out times TL and TH can be shorter, but there is limit in how small the resistance can be made.

Generally, in a semiconductor memory device, particularly a ROM, a transistor with the shortest possible channel length and width is used for each memory cell in order to make the chip size small as possible. To reduce the resistance R6 as mentioned above results in enlarging the channel width the transistor 6. Therefore, the memory size and hence the chip size are also made large. This is the reason for the restriction in reducing the size of the resistance R6.

As a result of the progress of the integrating technology in microelectronics, the transistor size is further reduced while the memory capacity of the semiconductor memory is increased. Accordingly, the number of transistors connected to one data line 2 is correspondingly increased, resulting in the increase of a capacity of the data line 2. Consequently, the ratio of charge/discharge time of the data line 2 to the total read out time is increased (address data inputted to the memory data is read out from the output buffer 8). In the case of FIG. 2, this is equivalent to the increase of the capacitance C. Accordingly, it is impossible to to make both the read out times TL and TH small, and therefore, the selection of the read out times TL and TH must be a compromise between both the times.

The read out times TL and TH can be changed by adjusting the threshold level VTH. Even this method involves a conflicting interrelation between the shortenings of the time TL and the time TH. When the level VTH is set high, the time TL can be made short, but the time TH is long. Conversely, when the level VTH is set low, the time TH can be made short, though the time TL is long. Therefore, it is impossible to shorten both the read out times TL and TH, whatever threshold VTH is selected.

SUMMARY OF THE INVENTION

The present invention therefore, has an object to provide a memory device with a sense amplifier capable of shortening a read out time of stored data.

To achieve the above object, a memory device according to the present invention is provided with a sense amplifier having two threshold levels each for independently distinguishing a logic 0 stored in each memory cell from a logic 1 and vice versa. The threshold level of the sense amplifier is changed for detecting the data stored in a newly-selected memory cell in accordance with the data stored in the memory cell already selected.

The threshold levels are a first threshold level VH equal to or slightly less than the maximum potential at a sensing point connected to the memory cells and a second threshold levl VL equal to or slightly more than the minimum potential at the sensing point. A logic 0 of the stored data is sensed when a potential VS at the sensing point is less than the first threshold level VH, a logic 1 of the stored data is sensed when the potential Vs is more than the second threshold level VL. Since the two threshold levels VH and VL are independent of each other, it is possible to make both the read times of the logic 0 and logic 1 as short as possible. The read out times are little effected by the charge/discharge speed at the sensing point.

BRIEF DESCRIPTION OF THE DRAWINGS

FIGS. 6 and 6A to 6G are timing diagrams useful in explaining the operation of the circuitry shown in FIG. 5;

FIG. 7 shows a circuit diagram of a sense amplifier according to the present invention which is suitable for a static RAM;

FIGS. 14A to 14I are a series of timing diagrams for illustrating the operation of the sense amplifier shown in FIGS. 12 and 13;

FIGS. 16A to 16I are a series of timing diagrams for illustrating the operation of the circuitry shown in FIG. 15;

FIGS. 18A to 18G are a set of timing charts for illustrating the operation of the circuitry shown in FIG. 17.

DETAILED DESCRIPTION OF THE PREFERRED EMBODIMENTS

Before proceeding with the description of the embodiments of the invention, it will expressly be understood that like reference symbols are used to designate like portions throughout the drawings for simplicity of illustration and that the components designated by like reference symbols may easily be replaced with each other or one another with minor change thereof by a skilled person in the art. An embodiment of a memory device according to the invention will be described.

Figure 4:
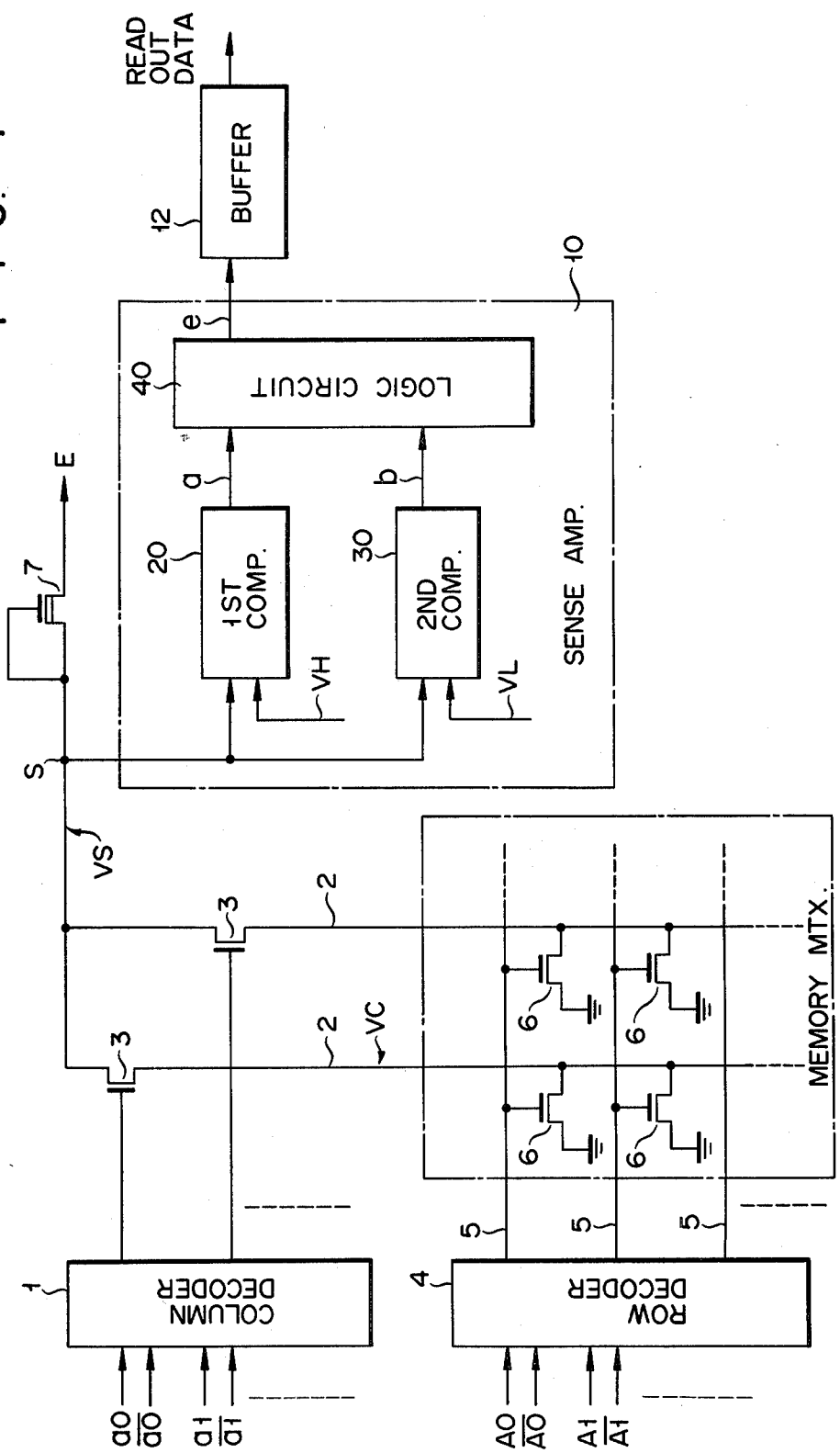
FIG. 4 shows a general configuration of a ROM including a sense amplifier according to the present invention.

Referring to FIG. 4, there is shown a sense amplifier according to the invention. Stored data of a memory cell transistors 6 corresponds to charged voltages VC of a data line 2. The voltage VC is transmitted, as a sense potential VS, to a sensing point S via a MOS transistor 3 selected by a column decoder 1. The potential VS is applied to a first comparator 20 and a second comparator 30. The comparator 20 with a first threshold level VH produces a first comparison output a which is logic 0 when VS<VH. The comparator 30 with a second threshold level VL produces a second comparison output b which is logic 1 when VS>VL.

The outputs a and b are inputted to a logic circuit 40. The circuit 40 produces an output e which becomes logic 0 immediately after the potential VS goes less than the level VH, and becomes logic 1 immediately after the potential VS goes more than the level VL. The output e is read out of the memory device as read out data by way of an output buffer 12.

Figure 5:
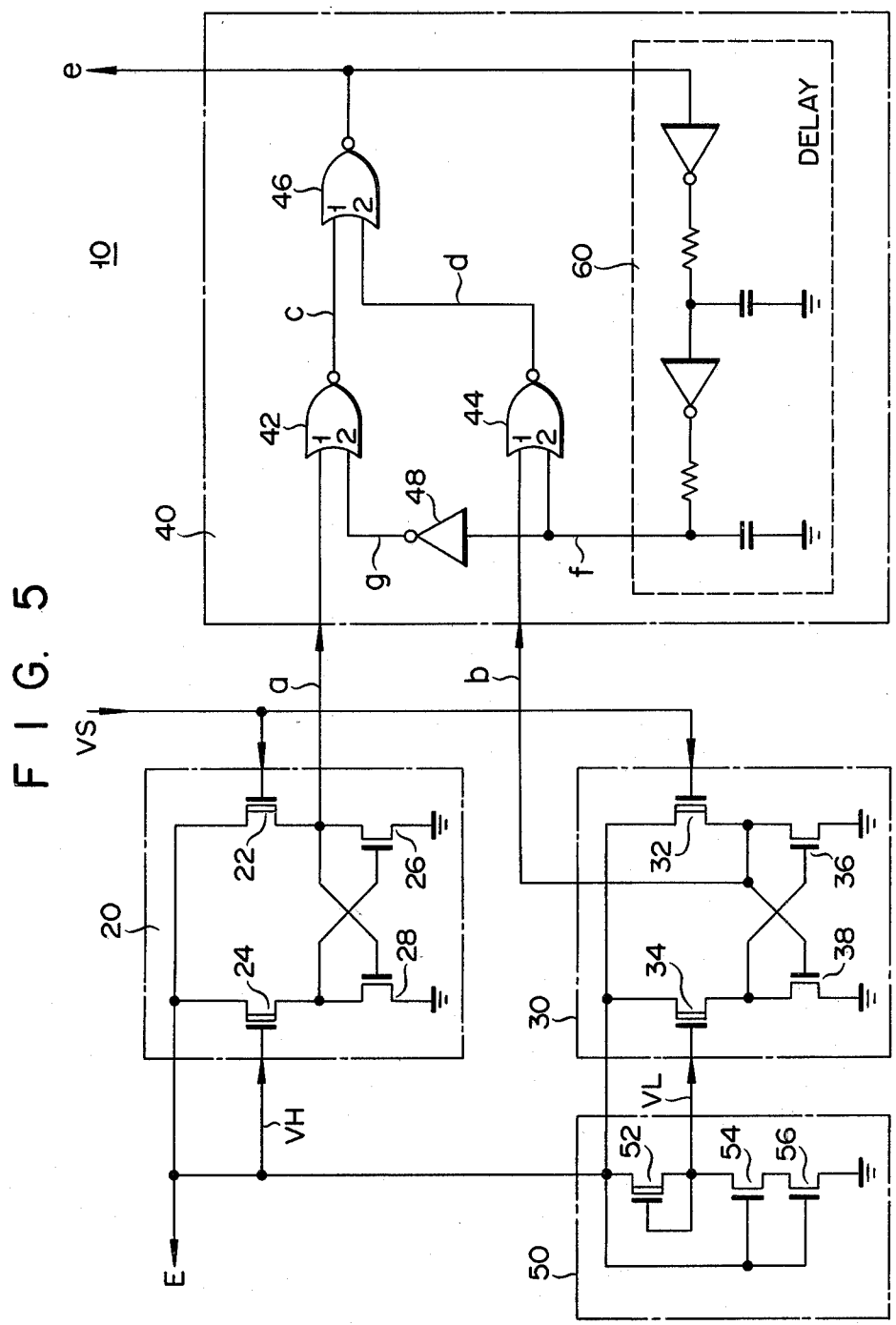
FIG. 5 shows an embodiment of a circuitry of the sense amplifier shown in FIG. 4.

FIG. 5 shows a detailed circuit diagram of the sense amplifier 10 shown in FIG. 4. The sense potential VS is applied to a gate of a depletion mode MOS transistor 22. A drain of the transistor 22 is coupled with the power supply potential E. A source of the transistor 22 is connected with a drain of an enhancement mode MOS transistor 26 and a gate of an enhancement mode MOS transistor 28. A gate of the transistor 26 and a drain of the transistor 28 are connected with a source of a depletion mode MOS transistor 24. Sources of the transistors 26 and 28 are grounded. A drain of the transistor 24 is coupled with the potential E. A gate of the transistor 24 receives the first threshold level VH. The maximum potential E is used here as the level VH. The transistors 26 and 28 form a cross-coupled type flip-flop. Pattern sizes of the transistors 22 to 28 are designed so that transistor 26 is turned OFF when VS≧VH, while turned ON when VS<VH.

The transistors 22 to 28 form the first comparator 20. The first comparison output a is derived from the drain of the transistor 26.

The second threshold level VL is obtained from a source of a depletion mode MOS transistor 52 in a voltage divider 50. A drain of the transistor 52 is connected to the power supply potential E. A source and a gate of the transistor 52 are coupled with a drain of an enhancement mode MOS transistor 54. A source of the transistor 54 is connected to a drain of an enhancement mode MOS transistor 56. A source of the transistor 56 is grounded. Gates of the transistors 54 and 56 are connected with the potential E.

The transistors 52, 54, and 56 have the same pattern sizes as those of said transistors 7, 3 and 6, respectively. The minimum level Ed of the potential VS is equal to a series voltage drop of drain-source paths of the transistors 3 and 6 which are both turned ON. The level VL is equal to a series voltage drop of drain-source paths of the transistors 54 and 56. Therefore, the second threshold level VL is equal to the minimum level Ed of the potential VS.

The sense potential VS is also applied to a gate of a depletion mode MOS transistor 32. A drain of the transistor 32 is coupled with the power supply potential E. A source of the transistor 32 is connected to a drain of an enhancement mode MOS transistor 36 and a gate of an enhancement mode MOS transistor 38. A gate of the transistor 36 and a drain of the transistor 38 are connected with a source of a depletion mode MOS transistor 34. Sources of the transistors 36 and 38 ar both grounded. A drain of the transistor 34 is connected to the potential E, and its gate is supplied with the second threshold level VL. The minimum potential Ed is used as the level VL here. Pattern sizes of the transistors 32 to 38 are so set that the transistor 36 is turned OFF when VS>VL, and the transistor 36 is turned ON when VS≦VL.

The transistors 32 to 38 make up the second comparator 30. This arrangement is the same as that of said first comparator 20. The second comparison output b is derived from a drain of the transistor 36.

The first comparison output a is applied to the first input of a NOR gate 42. The second comparison output b is applied to the first input of a NOR gate 44. A NOR output c of the gate 42 and a NOR output d of the gate 44 are applied to the first and second inputs of a NOR gate 46, respectively. A NOR output e of the gate 46 is inputted to a delay circuit 60. The circuit 60 includes integration circuits of two stages. Each of the integration circuits is comprised of an inverter and a CR low pass filter. A delayed output f outputted from the circuit 60 is applied to the second input of the gate 44. The output f is inverted into an inverted output g through an inverter 48. The output g is applied to the second input of the gate 42.

FIGS. 6 and 6A to 6G illustrate the operation of the circuitry of the sense amplifier 10 shown in FIG. 5.

Figure 6:
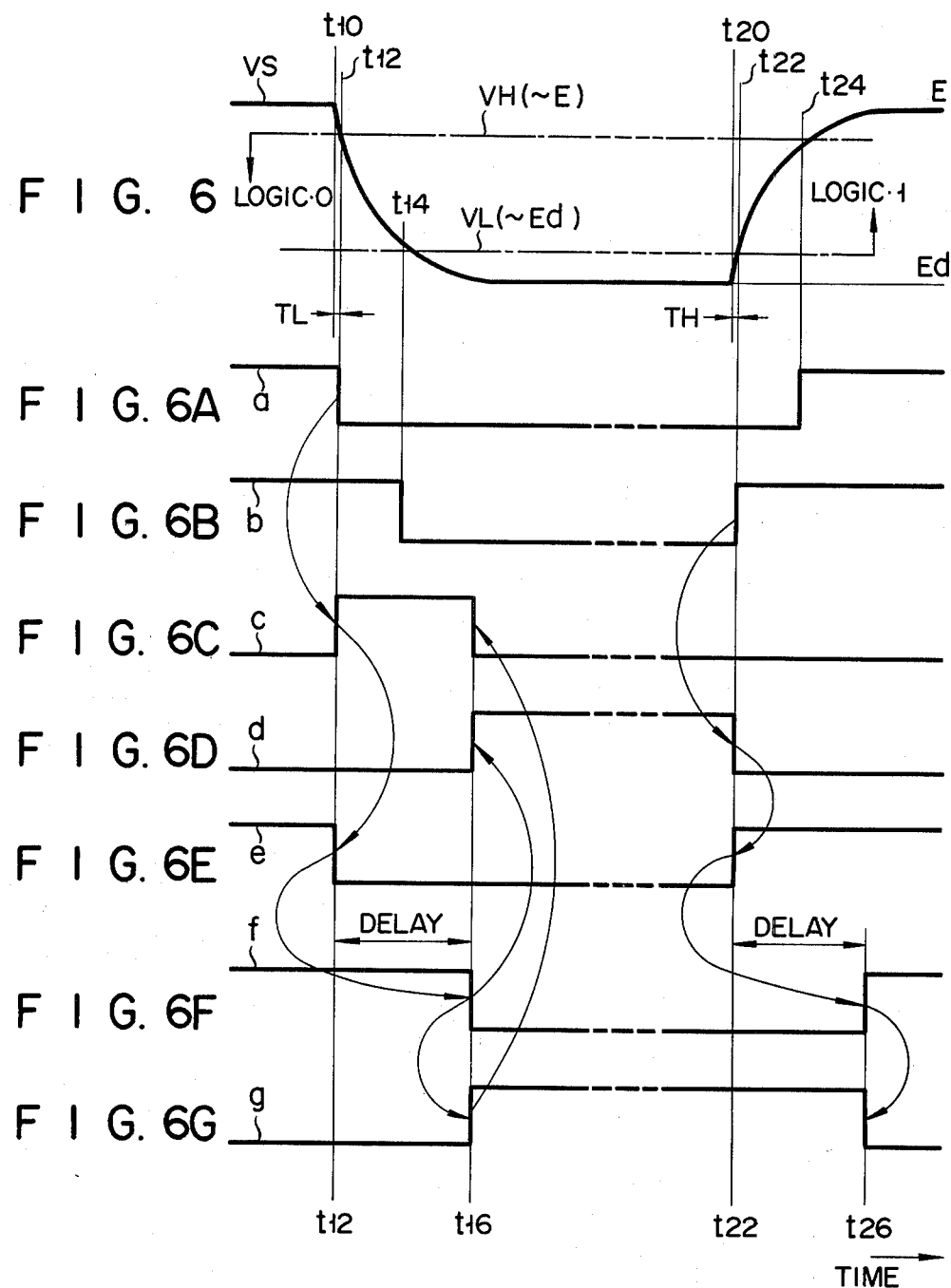

In FIG. 6, the first threshold level VH is illustrated lower than the maximum potential E, while the second threshold level VL is illustrated higher than the minimum potential Ed for a better understanding. All the MOS transistors are of the N channel type. It is evident that the levels VH and VL are actually set at these levels.

Figure 1:
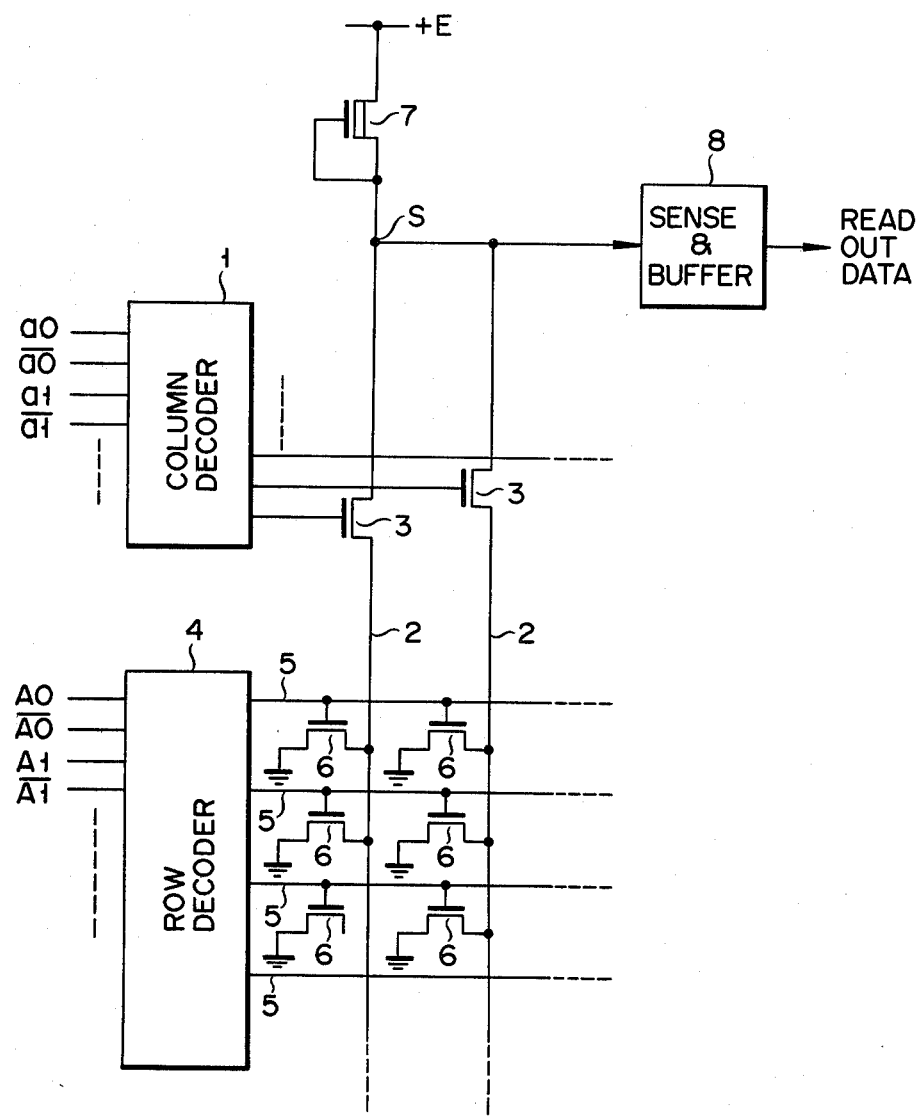
FIG. 1 shows a configuration of a general ROM.
Figure 2:
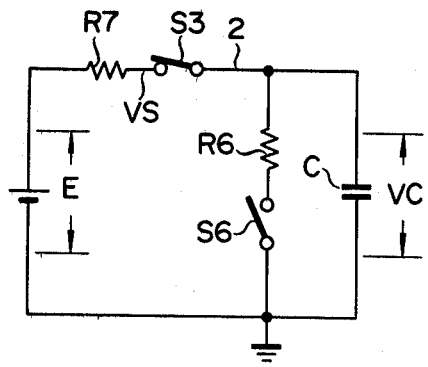
FIG. 2 shows a simple equivalent circuit for illustrating the charge and discharge of one data line of the ROM shown in FIG. 1.
Figure 3:
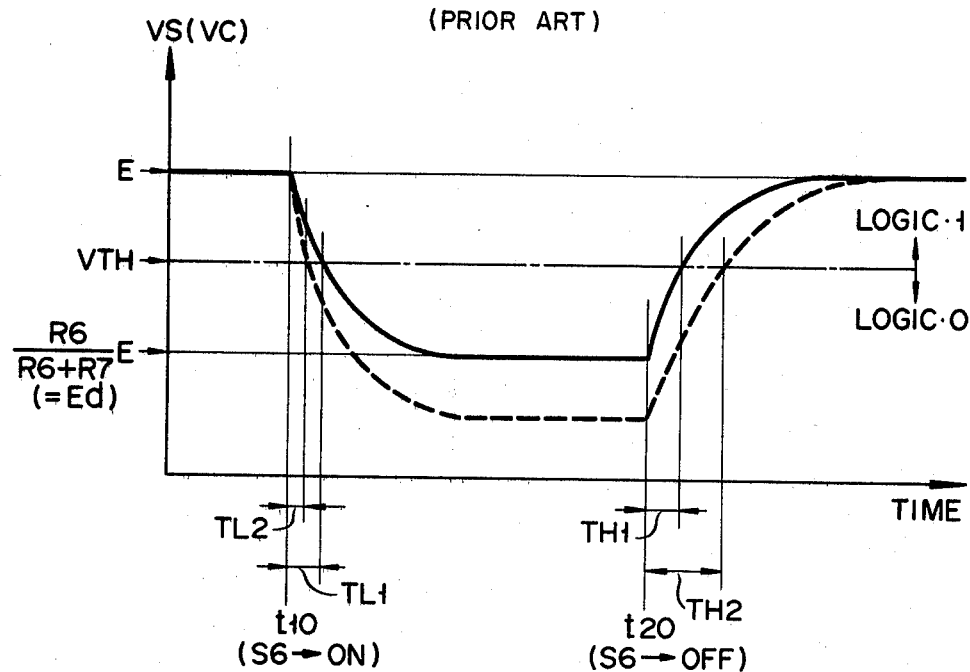
FIG. 3 shows a variation of the charge and discharge to and from a capacitance C shown in FIG. 2 with respect to time.

Assume that a memory cell transistor 6 from which the stored data is logic 1 of selected before time t10. This corresponds to a state that the transistor S6 is OFF in FIG. 2. Also in this case, the sensing point S is charged up to the power supply potential E, so that the sense potential VS is equal to the power supply potential E (FIG. 6). At time t10, when a transistor 6 with the stored data of logic 0 is selected, the data line 2 is discharged through the selected transistor 6. This state corresponds to a state that the transistor S6 is ON in FIG. 2. When the transistor 6 is turned ON, the charges stored in the capacitance C of the data line 2 are discharged through the conduction resistance R6 of the transistor 6. In the course of the discharge, the sense potential VS substantially exponentially attenuates from the maximum potential E toward the minimum potential Ed.

At time t12, when the sense potential VS is less than the first threshold level VH, VS<VH (~E), the transistor 26 in the first comparator 20 is turned ON and the output a of the comparator 20 becomes logic 0 (FIG. 6A). When the output a becomes logic 0, the NOR output c is logic 1 (FIG. 6C) and the NOR output e is logic 0 (FIG. 6E). When the sense potential VS is equal to or less than second threshold voltage VL, VS≦VL (~Ed) at time t14, the transistor 36 in the second comparator 30 is turned ON. Upon the turning on of the transistor 36, the output b becomes logic 0 (FIG. 6B).

The level change from logic 1 to logic 0 of the output e is delayed by a given time period (t12 and t16) by the delay circuit 60. At time t16, the delayed output f becomes logic 0 (FIG. 6F) and the inverted output g becomes logic 1 (FIG. 6G). With this logic 1, the NOR output c returns in the level to logic 0 (FIG. 6C). At time t16, the output b has a logic 0 (FIG. 6B). Accordingly, the logic 0 of the output f causes the output d to have a logic 1 (FIG. 6D). After time t16, the output c becomes logic 0, while the output d becomes logic 1. The output c is delayed behind the output d by the signal passage time of the inverter 48. Therefore, the output e keeps its level at logic 0.

At time t20, when the transistor 6 with a logic 1 as the stored data is selected, the charging operation for the data line 2 starts. The sense potential VS substantially exponentially rises from the minimum potential Ed toward the maximum potential E (FIG. 6).

At time t22, when VS>VL (FIG. 6), the transistor 36 in the comparator 30 is turned OFF and the output b becomes logic 1 (FIG. 6B). When the output b becomes logic 1, the NOR output d is logic 0 (FIG. 6D). At this time, the output c has a logic 0 (FIG. 6C), so that the NOR output e becomes logic 1 (FIG. 6E). At time t24, when VS≧VH, the transistor 26 of the comparator 20 is turned OFF and the output a is at a logic 1 (FIG. 6A). At time t24, the output g is a logic 1 and hence the NOR output c keeps its logic 0.

The level changing operation from logic 0 to logic 1 at the output e at time t22 is delayed by a given time period (t22 to t26) by the circuit 60. At time t26, the delayed output f is logic 1 (FIG. 6F) and the inverted output g is logic 0 (FIG. 6G). At time t26, the output a is logic 1 (FIG. 6A), so that the NOR output c remains its logic 0 (FIG. 6C). At time t26, the output b is also logic 1, so that the NOR output d remains its logic 0 (FIG. 6D). Accordingly, also at time t26, the NOR output e keeps its logic 1 level (FIG. 6E). The operation after time t26 is a repeat of the operation during the time period from time t10 to time t26.

The stored data in the memory cells are read out as the output e. When the stored data is logic 0, the output e is also logic 0, while when the stored data is logic 1, the output e is logic 1.

The delay time in the delay circuit 60 is selected so as to satisfy the following relations.

$$(t14-t12) \leq (t16-t12)$$

$$(t24-t22) \leq (t26-t22)$$

The delay time is preferably short as possible, so far as the above relations are satisfied. If the above relations are satisfied, a level change point (t16 or t26) of the output f of the circuit 60 appears at an instant that a potential change (dVS/dt) of the potential VS substantially disappears (dVS/dt=0).

FIGS. 6 and 6E shows the following facts.

(1) The read out time TL is extremely short, which ranges from an instant (t10) that the memory cell with the logic 0 data is selected till the logic 0 data is read out (t12).

(2) The read out time TH is also extremely short, which ranges from an instant (t20) that the memory cell of logic 1 is selected till the logic 1 is read out (t22). Consequently, ROMs, static RAMs or the like of which the data read out speed is extremely high can be fabricated by using the sense amplifier according to the present invention.

Incidentally, the transistors 54 and 56 in the divider 50 are not necessarily always in an ON state but may be turned ON when the comparison is made by a signal synchronized with the operation timing of the decoder 1.

FIG. 7 shows a circuit arrangement of a sense amplifier of the invention which adapts well for a static RAM. The potential VS on a data line is inputted to a delay circuit 60. A delayed output h of the circuit 60 is level-inverted to an inverted output h by an inverter 62. The potential VS is applied to gates of enhancement mode MOS transistors 70 and 72. Drains of the transistors 70 and 72 are connected together to a source and a gate of a depletion mode MOS transistor 74.

A drain of the transistor 74 is connected with a positive supply voltage VD. The voltage VD correspond to the potential E of FIG. 5. A source of the transistor 70 is coupled with a drain of an enhancement mode MOS transistor 76. A source of the transistor 72 is connected to a drain of an enhancement mode MOS transistor 78. A gate of the transistor 76 is connected with the voltage VD and a gate of the transistor 78 is connected to the output of the inverter 62.

A potential $\overline{VS}$ of an inverted data line is applied to gates of enhancement mode MOS transistors 80 and 82. Drains of the transistors 80 and 82 are connected together to a source and a gate of a depletion mode MOS transistor 84. A drain of the transistor 84 is connected with the voltage VD. A source of the transistor 80 is connected to a drain of an enhancement mode MOS transistor 86. A source of the transistor 82 is coupled with a drain of an enhancement mode MOS transistor 88. A gate of the transistor 86 is connected to the voltage VD, and a gate of the transistor 88 is coupled with the output of the circuit 60. Sources of the transistors 76, 78, 86 and 88 are connected with a drain of a depletion mode MOS transistor 90. A gate and a source of the transistor 90 are connected together to another supply voltage VE corresponding to the ground potential in FIG. 5.

The transistors 70 to 78 and the transistors 80 to 88 make up a differential amplifier 100 having a transistor 90 as a common impedance. When the transistor 78 is turned ON and the transistor 88 is turned OFF, the transconductance (gm) of the transistors 70 and 72 goes high, while the transconductance of the transistor 80 is low. On the other hand, when the transistor 78 is OFF and the transistor 88 is turned ON, the transconductance of the transistors 80 and 82 goes high, while the transconductance of the transistor 70 is low. A difference between those transconductances (gm) puts the input level balance of the differential amplifier 100 into disorder. This is a key to the circuit of FIG. 7.

FIGS. 8A to 8C graphically illustrate the operation of the FIG. 7 circuit. Before time t30, the sense potential VS, the output h, and output e are all logic 1, while the outputs $\overline{VS}$, $\overline{h}$ and $\overline{e}$ are all logic 0. At this time, the transistor 70 is turned ON, while the transistors 72, 80 and 82 are turned OFF. In this case, the transistor 70 is a low gm, and the transistors 80 and 82 are a high gm.

At time t30, when the memory cell of logic 0 is selected, the potential VS starts to fall, while the potential $\overline{VS}$ starts to rise. If there is no difference among those gm's, the output e and $\overline{e}$ of the differential amplifier 100 are not level-inverted until time t34 when VS<$\overline{VS}$. However, the level inversion in fact takes place at the outputs e and $\overline{e}$ even when VS>$\overline{VS}$, since the transistors 80 and 82 supplied with the potential $\overline{VS}$ have high gm. When VS<VH at time t32 (FIG. 8A), the transistors 80 and 82 are turned ON, while the transistor 70 is turned OFF. Then, the output e is logic 0 and the output $\overline{e}$ is logic 1 (FIG. 8C).

Following the level inversion of the potential VS, at time t36, the delayed output h is logic 0 and the inverted output $\overline{h}$ is logic 1 (FIG. 8B). At time t36, when the outputs h and $\overline{h}$ are logic 0 and logic 1, respectively, the transistor 88 is turned OFF. Upon this, the transistor 82 is also cut off to zero the drain current of the transistor 82. Then, the voltage drop by the transistor 84 becomes small, so that the potential of the output rises slightly (FIG. 8C). Because of a slight amount of the potential rise, the output e yet remains logic 0. At time t36, the transistors 70 and 72 are both turned OFF and hence the potential of the output $\overline{e}$ keeps its state.

When the differential amplifier 100 is of the non-cut-off type, the transistors 70 and 72 are slightly conductive even if the potential VS is a low potential. In this case, the logic 1 state of the output $\overline{h}$ turns ON the transistor 78. As a result, the voltage drop by the transistor 74 increases, so that the potential of the output $\overline{e}$ slightly falls (as indicated by a broken line during the time period t36 to t40 in FIG. 8C). However, since the potential drop is slight, the output $\overline{e}$ keeps the logic 1 level. In this case, the transistors 70, 72, 80 and 82 are preferably of the depletion mode type.

At time t40, when a memory cell of logic 1 is selected, the potential starts to rise, but the potential $\overline{VS}$ starts to drop. If the gm's of the transistors are equal to one another, the outputs e and $\overline{e}$ are not level-inverted until time t44 when VS>$\overline{VS}$. At time t40, however, the transistor 78 is turned ON and the transistor 88 is turned OFF. Accordingly, the transistors 70 and 72 supplied with the potential VS have a high gm and the transistor 80 has a low gm. For this reason, the level inversion takes place even if VS<$\overline{VS}$. At time t42, when VS>VL holds (FIG. 8A), the transistors 70 and 72 are turned ON and the transistor 80 is turned OFF. As a result, the output $\overline{e}$ is logic 0 and the output e is logic 1 (FIG. 8C).

At time t46 after a given period of time (t40 to t46) from the level inversion of the potential VS, the outputs h and h̄ are logic 1 and logic 0, respectively (FIG. 8B). Then, the transistor 78 is turned OFF and the potential of the output ē slightly rises (FIG. 8C). After time t46, the circuit state returns to that before time t30. If the transistors 80 and 82 are conductive under a condition that the V̄S̄ is at a low level, the potential of the output e slightly drops while keeping the logic 1 state.

Figure 8:
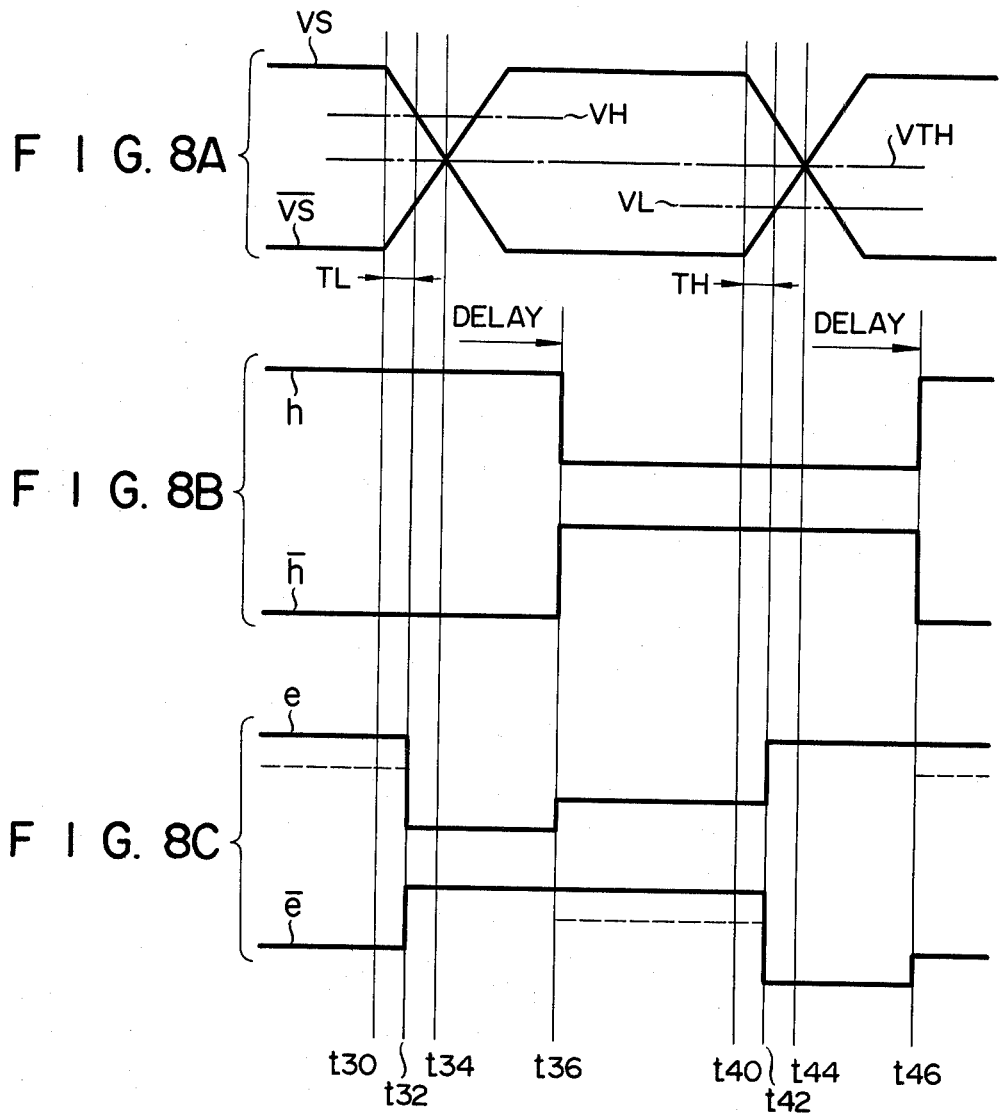
FIGS. 8A to 8C are timing diagrams useful in explaining the operation of the circuitry shown in FIG. 7.

In FIG. 7, if no transistors 72, 78, 82 and 88 are used, that is to say, the present invention is not applied to the circuit arrangement, the threshold level for detecting the sense potential VS is only one level VTH shown in FIG. 8A. On the other hand, the circuit arrangement according to the present invention has the two threshold levels; the first threshold level VH for detecting the logic 0 of the output e and the second threshold level VL for detecting the logic 1 of the output e. As seen from FIG. 8, if the level VH is set much closer to the maximum level of the potential VS, the read out time TL for the logic 0 is extremely short. Similarly, if the level VL is set much closer to the minimum level of the potential VS, the read out time TH for logic 1 is considerably short. In other words, a memory device at a high read out speed can be realized without speeding up the change of the potential VS.

If a plurality of transistors connected in parallel are used for the transistor 82, the transistor 82 has a higher gm than the transistor 70, resulting in setting the level VH high. If the transistor 72 is substituted by a plurality of transistors parallel connected, its gm is higher than that of the transistor 80. The high gm may also be obtained by increasing the sizes of the transistors 72 and 82. Alternately, the threshold voltage of the transistor 82 may be set lower than that of the transistor 70, and the threshold voltage of the transistor 72 may be set lower than that of the transistor 80.

Figure 9:
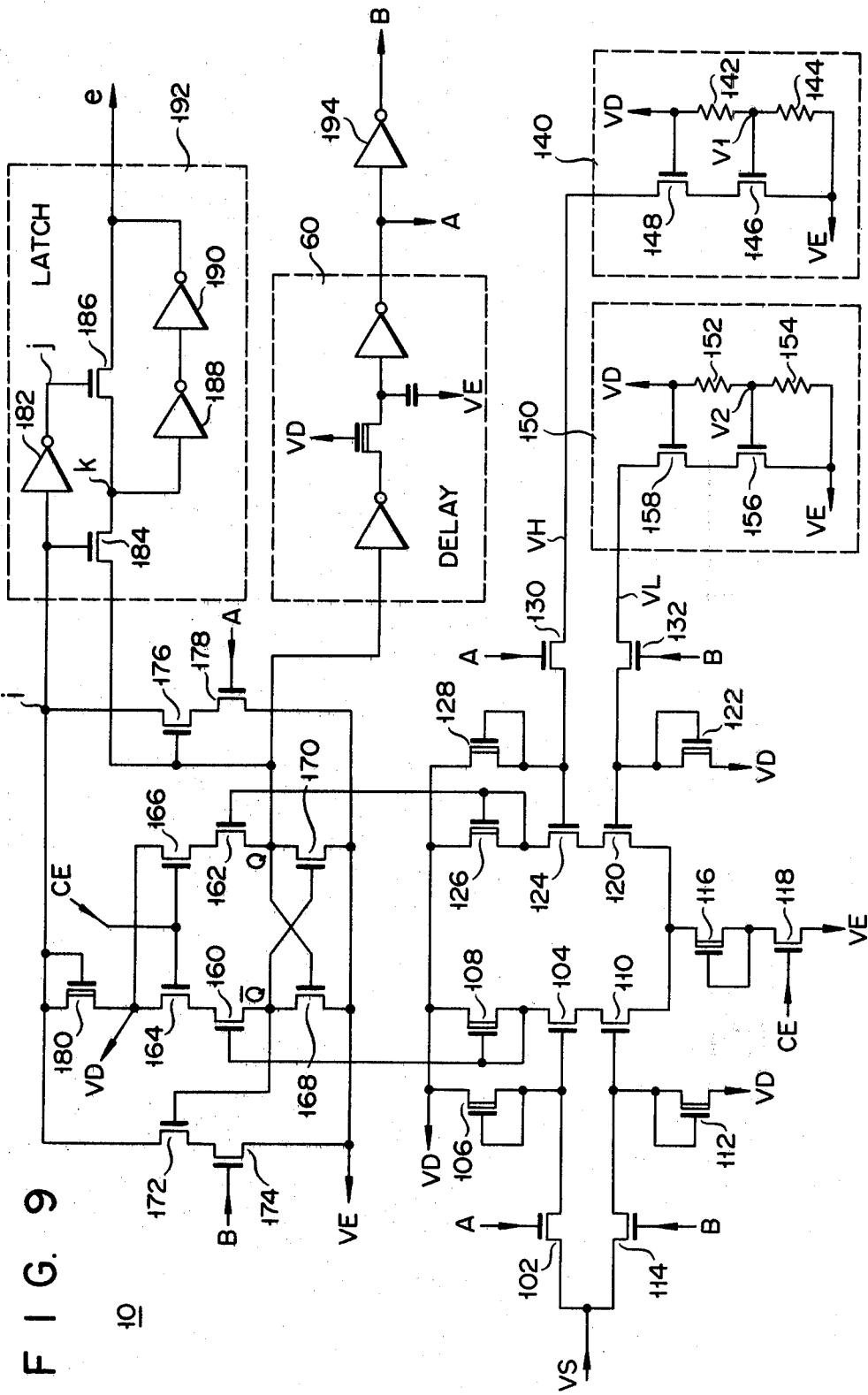
FIG. 9 is a circuit arrangement of a modification of the sense amplifier shown in FIG. 4.

FIG. 9 shows an arrangement of a modification of the sense amplifier 10 shown in FIG. 4. A single comparator is used here, and either of two levels VH and VL is used as its comparison level. To be more specific, the first threshold level VH is used for the read out of logic 0, and the second threshold level VL is used for the read out of logic 1.

The sense potential VS is applied to a gate of an enhancement mode MOS transistor 104 by way of a drain-source path of an enhancement mode MOS transistor 102. A gate of the transistor 104 is connected with a positive supply voltage VD via a source-drain path of a depletion mode MOS transistor 106. A gate of the transistor 106 is coupled with its source. A drain of the transistor 104 is connected with a gate and a source of a depletion mode MOS transistor 108. A drain of the transistor 108 is connected to the voltage VD. A source of the transistor 104 is connected with a drain of an enhancement mode MOS transistor 110. A gate of the transistor 110 is connected to the voltage VD through a source-drain path of a depletion mode MOS transistor 112 whose gate is coupled with its source. A gate of the transistor 110 receives the potential VS by way of a drain-source path of an enhancement mode MOS transistor 114.

A source of the transistor 110 is connected with a drain of a depletion mode MOS transistor 116. A gate and a source of the transistor 116 are coupled with another supply voltage VE through a drain-source path of an enhancement mode MOS transistor 118. The voltage VE may be the ground level. A gate of the transistor 118 receives a chip enable signal CE. The signal CE becomes logic 1 when its memory chip is in an active state. When the signal CE is logic 0, circuit elements in the chip are powered off to prevent power dissipation.

A drain of the transistor 116 is connected to a source of an enhancement mode MOS transistor 120. A gate of the transistor 120 is connected with the voltage VD via a source-drain path of a depletion mode MOS transistor 122. A gate of the transistor 122 is connected with its source. A drain of the transistor 120 is coupled with a source of an enhancement mode MOS transistor 124. A drain of the transistor 124 is connected to a gate and a source of a depletion mode MOS transistor 126. A gate of the transistor 124 is connected with a gate and a source of a depletion mode MOS transistor 128. Drains of the transistors 126 and 128 are connected to the voltage VD.

A first threshold level VH is applied to a gate of the transistor 124 via a drain-source path of an enhancement mode MOS transistor 130. A gate of the transistor 120 is supplied with a second threshold level VL by way of a drain-source path of an enhancement mode MOS transistor 132.

The level VH is obtained from a first threshold level source 140. The source 140 has series resistors 142 and 144 connected between the voltages VD and VE. A first divided voltage V1 which appears at a junction point of the resistors 142 and 144 is applied to a gate of an enhancement mode MOS transistor 146. A source of the transistor 146 is connected with the voltage VE, and its drain is connected to the transistor 130 via a drain-source path of an enhancement mode MOS transistor 148. A gate of the transistor 148 is coupled with the voltage VD.

The level VL is obtained from a second threshold level source 150. The source 150 includes series resistors 152 and 154 connected between the voltages VD and VE. A second divided voltage V2 which appears at a junction point of the resistors 152 and 154 is applied to a gate of an enhancement mode MOS transistor 156. A source of the transistor 156 is connected with the voltage VE and its drain is coupled with the transistor 132 through a drain-source path of an enhancement mode MOS transistor 158. A gate of the transistor 158 is connected to the voltage VD.

The sources 140 and 150 have the same configurations. Resistors 142, 144, 152 and 154 are so set that V2 is larger than V1. Since V2>V1, a drain current of the transistor 156 is larger than that of the transistor 146, if the sizes of the transistors 146 and 156 are equal to each other. Therefore, a drain potential VL of the transistor 158 is lower than a drain potential VH of the transistor 148.

A drain of the transistor 104 is connected with a gate of an enhancement mode MOS transistor 160. A drain of the transistor 124 is connected with a gate of an enhancement mode MOS transistor 162. Drains of the transistors 160 and 162 are coupled with the voltage VD by way of source-drain paths of enhancement mode MOS transistors 164 and 166, respectively. Gates of the transistors 164 and 166 receive the chip enable signal CE. A source of the transistor 160 is connected to each drain and gate of each of enhancement mode MOS transistors 168 and 170. A source of the transistor 162 is respectively coupled with each gate and drain of the transistors 168 and 170. Sources of the transistors 168 and 170 are connected to the voltage VE.

A signal $\bar{Q}$ which appears at a source of the transistor 160 is applied to a gate of an enhancement mode MOS transistor 172. A source of the transistor 172 is connected to the voltage VE by way of a drain-source path of an enhancement mode MOS transistor 174. A signal Q which appears at a source of the transistor 162 is fed to a gate of an enhancement mode MOS transistor 176. A source of the transistor 176 is connected with the voltage VE through a drain-source path of an enhancement mode MOS transistor 178. Drains of the transistors 172 and 176 are coupled with a gate and a source of a depletion mode MOS transistor 180. A drain of the transistor 180 is connected to the voltage VD.

A signal i at a source of the transistor 180 is inputted to an inverter 182 and a gate of an enhancement mode MOS transistor 184. An output j from the inverter 182 is applied to a gate of an enhancement mode MOS transistor 186. A signal k which appears at a junction point of the transistors 184 and 186 is converted to an output e through inverters 188 and 190. The transistor 184 is connected between a source of the transistor 162 and an input terminal of the inverter 188. The transistor 186 is connected between the input terminal of the inverter 188 and an output terminal of the inverter 190. The components 182 to 190 form a latch circuit 192 to latch a level change of the signal Q.

The signal Q is delayed by a predetermined time by a delay circuit 60. A delayed output A of the circuit 60 is inverted into an inverted output B by an inverter 194. The output A is applied to the gates of the transistors 102, 130 and 178. Further, the output B is fed to the gates of the transistors 114, 132 and 174.

Figure 10:
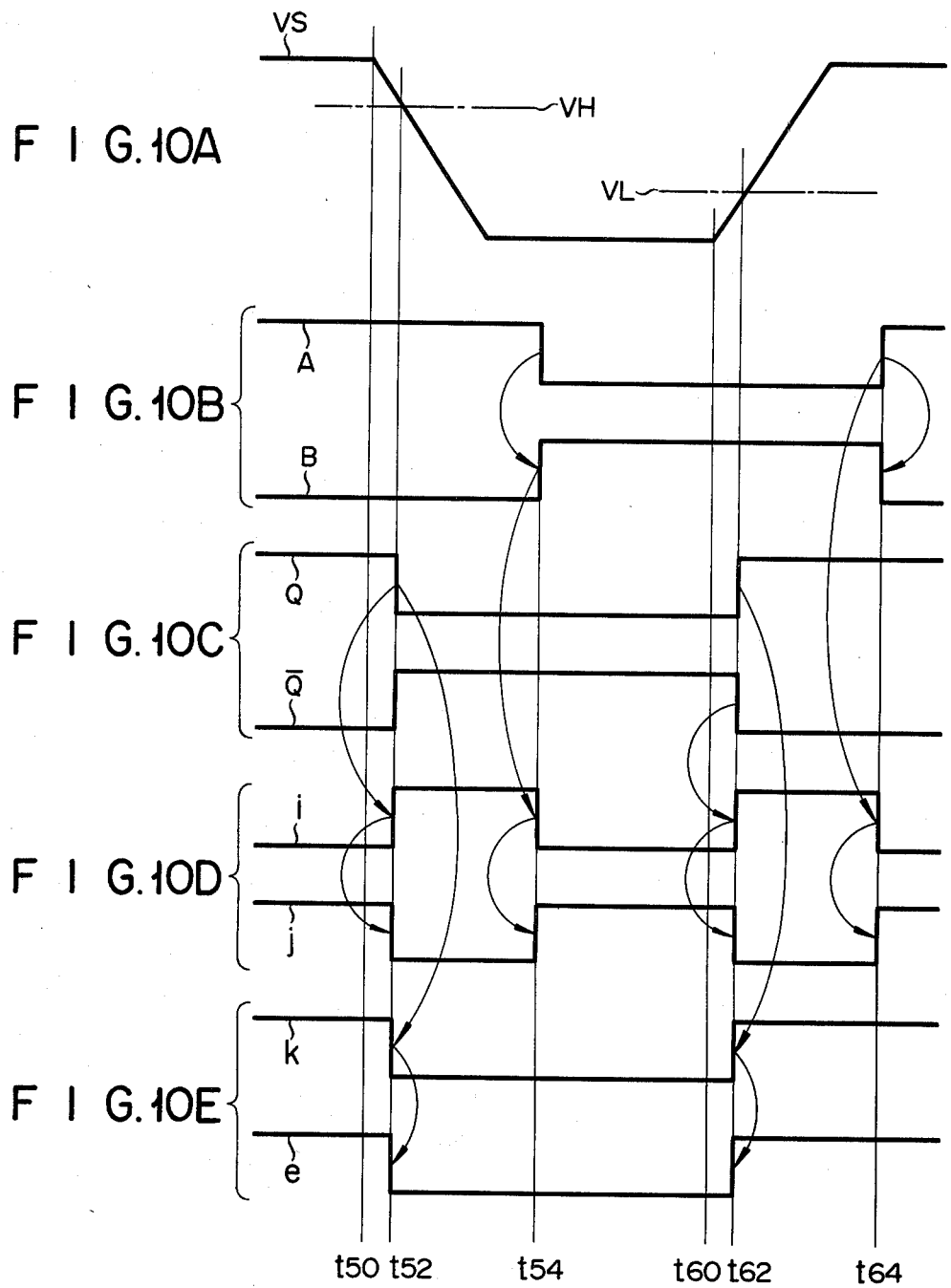
FIGS. 10A to 10E are timing diagrams illustrating a sequence of signals in the operation of the circuitry shown in FIG. 9.

FIGS. 10A to 10E graphically illustrate the operation of the sense amplifier 10 shown in FIG. 9. Before time t50, the delayed output A is logic 1 and the inverted output B is logic 0 (FIG. 10B). Accordingly, the potential VS is applied to the transistor 104 and the first threshold level VH is applied to the transistor 124. Before time t50, VS>VH and the transistor 104 is ON and the transistor 124 is almost OFF. Accordingly, the signal Q is logic 1 and the inverted signal $\bar{Q}$ is logic 0 (FIG. 10C).

When a memory cell of logic 0 is selected at time t50, the potential VS starts to drop. When VS<VH at time t52 (FIG. 10A), a differential amplifier made up of the transistors 104, 116 and 124 is level-inverted, so that Q=logic 0 and $\bar{Q}$=logic 1 (FIG. 10C). When Q=logic 0, the transistor 176 is turned OFF, and the signals i and j are logic 1 and 0, respectively (FIG. 10D). A state of i=logic 1 turns ON the transistor 184, while a state that j=logic 0 turns OFF the transistor 186. Then, Q=k=e=logic 0 holds (FIG. 10E). Thus, at time t52, the stored data of logic 0 is read out as the output e.

At time t54 after the delay by the circuit 60, the outputs A and B are level-inverted (FIG. 10B). When the output B is logic 1, the transistor 174 is turned ON. At this time point, the transistor 172 has been turned ON by a state of $\bar{Q}$=logic 1, and therefore i=logic 0 and j=logic 1 (FIG. 10D). As the result of the logic state that j=logic 1, the logic state of the signals of k and e, k=e=logic 0, is latched.

After time t54, the logic states of the signals A and B are logic 0 and logic 1, respectively (FIG. 10B). As a result, the potential VS is applied to the transistor 110 and the second threshold level VL is applied to the transistor 120. Before time t60, the transistor 110 is almost turned OFF, and the transistor 120 is turned ON. Accordingly, Q=logic 0 and $\bar{Q}$=logic 1 (FIG. 10C).

When the memory cell of logic 1 is selected at time t60, the potential VS starts to rise. At time t62, when VS>VL (FIG. 10A), a differential amplifier comprising the transistors 110, 116 and 120 is level-inverted, with the result that Q=logic 1 and $\bar{Q}$=logic 0 (FIG. 10C). When $\bar{Q}$=logic 0, the transistor 172 is turned OFF and i=logic 1 and j=logic 0 (FIG. 10D). Then, the transistor 184 is turned ON and the transistor 186 is turned OFF, and Q=k=e=logic 1 (FIG. 10E). Thus, at time t62, the stored data logic 1 is read out as the output e.

At time t64, the delayed outputs A and B are level-inverted (FIG. 10B). A logical state of the output A, A=logic 1, turns ON the transistor 178. The transistor 176 has already been turned ON by the logical state of the signal Q, Q=logic 1. Accordingly, i=logic 0 and j=logic 1 (FIG. 10D). By the j=logic 1, logical state of the signals k and e, k=e=logic 1, is latched. After time t64, the same operation as that during a period from time t50 to t64 is repeated.

Figure 11:
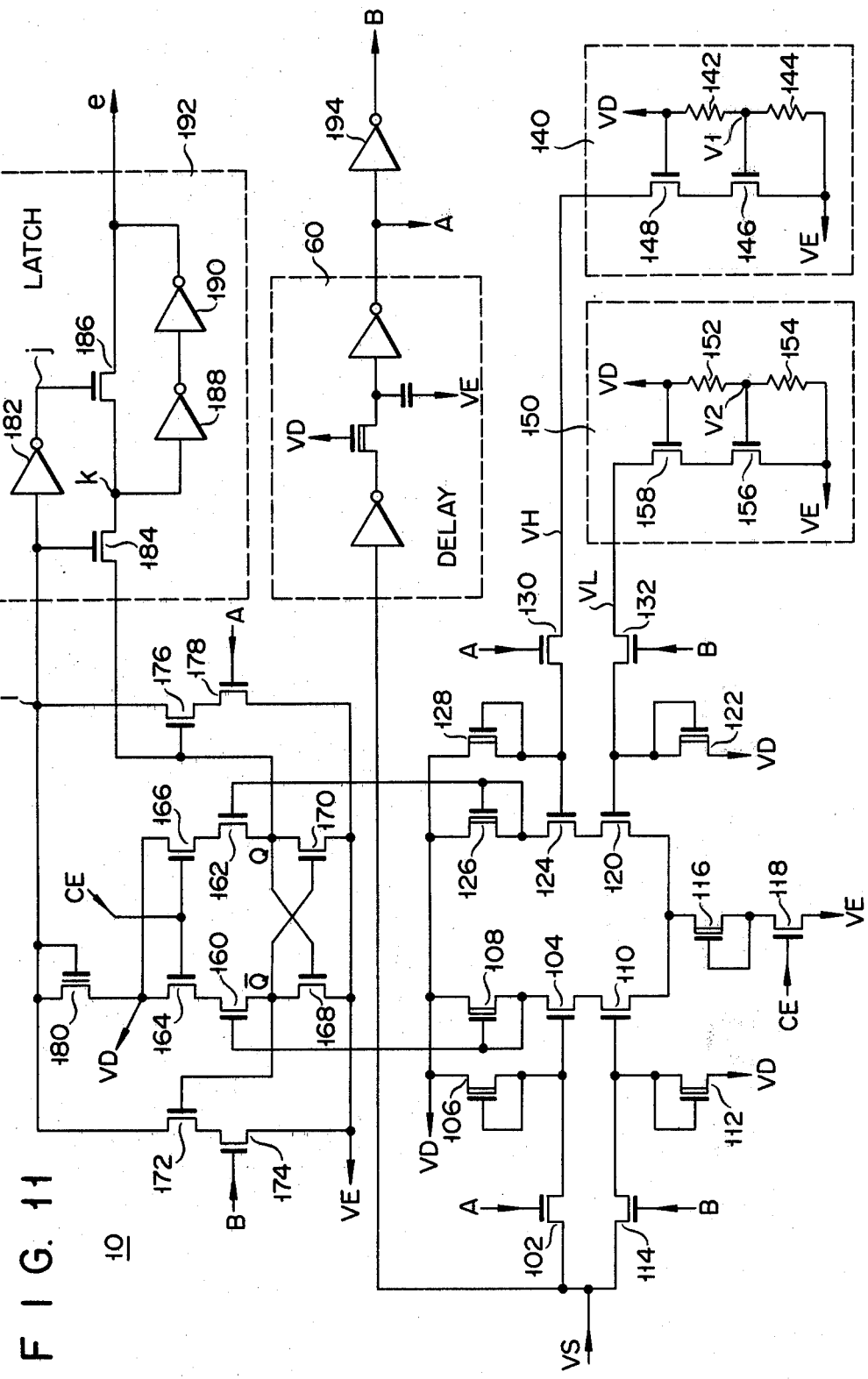
FIG. 11 is a circuit arrangement of a modification of FIG. 9.

FIG. 11 shows a modification of the FIG. 9 circuit. In the modification, the sense potential VS is inputted into the delay circuit 60. The remaining construction is the same as that of the FIG. 9 circuit. A basic operation of this modification is the same as that of the FIG. 9 circuit. In FIGS. 9 and 11, the threshold voltage of each of the transistors 104, 110, 120, 124, 160, 162, 164 and 166 is preferably about 0 V. The reason for this is that the logic level "1" at the Q and $\bar{Q}$ may be set at higher potential. In this example, the voltages VH and VL are switched by the transistors 130 and 132, but the voltages V1 and V2 may be switched in place of them. In the latter case, the number of the transistors may be reduced.

Figure 12:
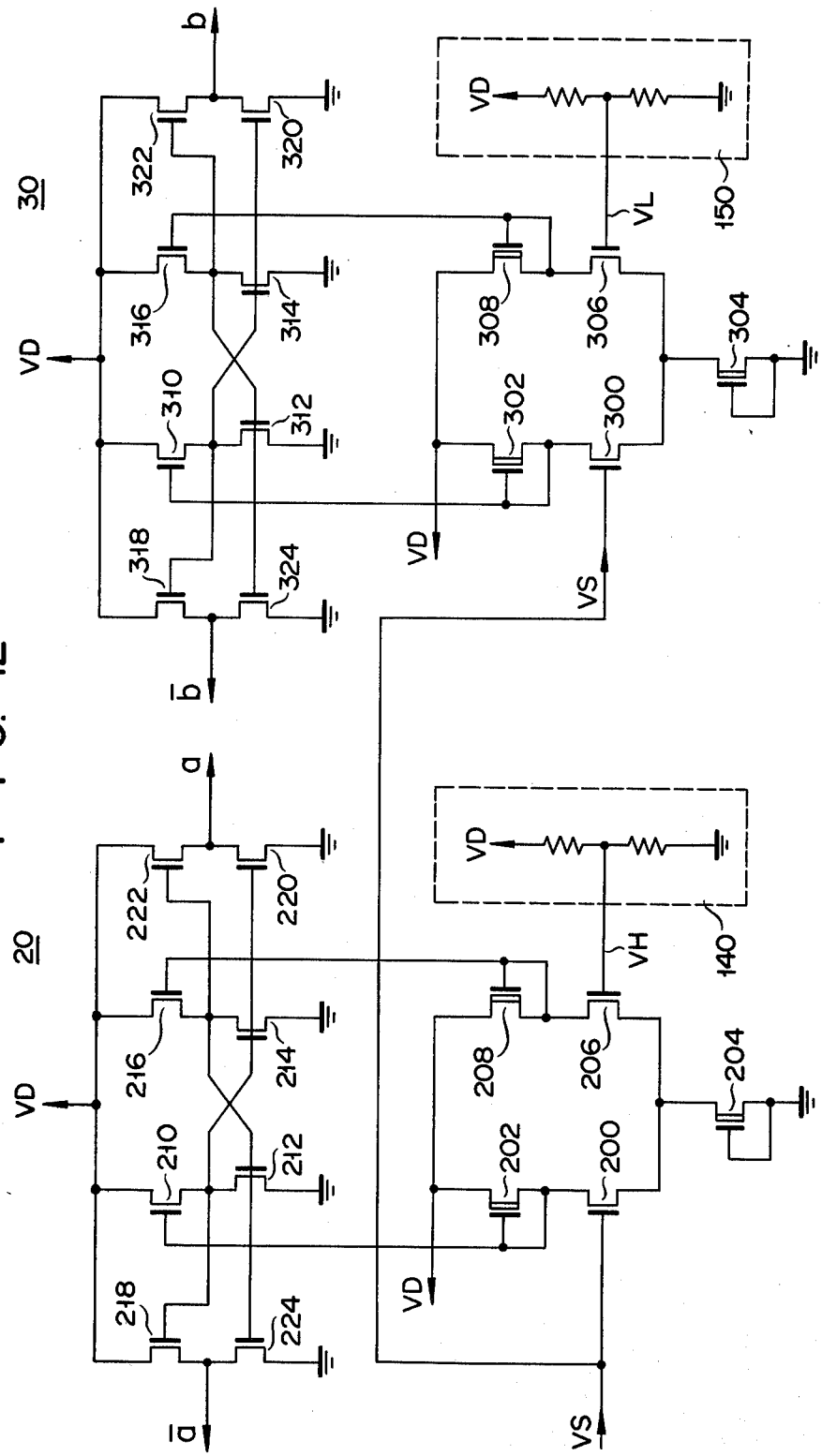
FIG. 12 is a circuit arrangement of another example of the circuitry of each of the comparators shown in FIG. 4.

FIG. 12 shows another example of the comparators 20 and 30 shown in FIG. 4. The sense potential VS is inputted to a gate of an enhancement mode MOS transistor 200. A drain of the transistor 200 is connected with a gate and a source of a depletion mode MOS transistor 202. A source of the transistor 200 is connected to a drain of a depletion mode MOS transistor 204 and a source of an enhancement mode MOS transistor 206. A gate and a source of the transistor 204 are grounded. A drain of the transistor 206 is coupled with a gate and a source of a depletion mode MOS transistor 208. Drains of the transistors 202 and 208 are connected to a positive supply voltage VD. A gate of the transistor 206 receives a first threshold level VH. The level VH is derived from a first threshold level source (voltage divider) 140.

A drain of the transistor 200 is coupled with a gate of an enhancement mode MOS transistor 210. A source of the transistor 210 is connected with a drain and a gate of enhancement mode MOS transistors 212 and 214. Sources of the transistors 212 and 214 are grounded. A gate of the transistor 212 and a drain of the transistor 214 are connected to a source of an enhancement mode MOS transistor 216. A gate of the transistor 216 is coupled with a drain of the transistor 206. A source of the transistor 210 is connected to gates of enhancement mode MOS transistors 218 and 220. A source of the transistor 216 is connected with gates of enhancement mode MOS transistors 222 and 224. Sources of the transistors 220 and 224 are grounded. Drains of the transistors 210, 216, 218 and 222 are connected to the voltage VD. A first comparison output a is produced from a drain of the transistor 220, and an inverted output $\bar{a}$ is produced from a drain of the transistor 224.

The transistors 200 to 224 make up the first comparator 20. The comparison output a is logic 1 in the condition of VS>VH. When VS<VH, the output a is logic 0. The output ā has an opposite logic level to that of the output a.

The potential VS is also inputted to a gate of an enhancement mode MOS transistor 300. The second comparator 30 has the same configuration as that of the first comparator 20. In FIG. 12, the same lower two digits of reference numerals represent common transistors. For example, the transistor 200 corresponds to the transistor 300. A gate of an enhancement mode MOS transistor 306 which forms a differential amplifier, together with the transistor 300, is applied with a second threshold level VL. The level VL is derived from a second threshold level source 150. A second comparison output b is derived from a drain of an enhancement mode MOS transistor 320. The output b is logic 1 when VS>VL, and is logic 0 when VS<VL. Further, an output b̄ with an opposite level to that of the output b is obtained from a drain of an enhancement mode MOS transistor 324.

Figure 13:
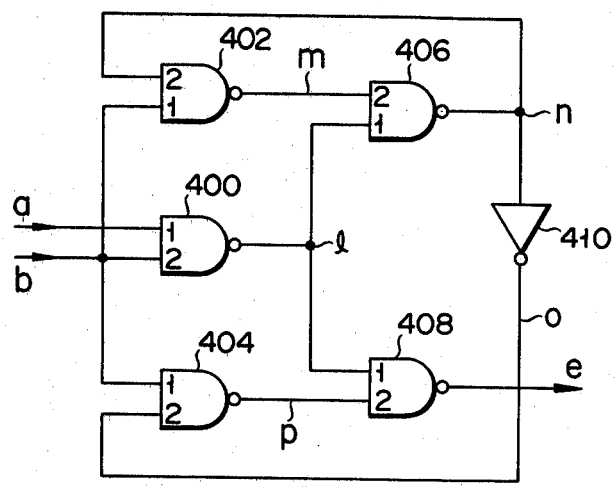
FIG. 13 diagrammatically shows a circuitry of a logic circuit connected to the comparators shown in FIG. 5 or FIG. 12.

FIG. 13 shows an arrangement of the logic circuit 40 connected to the comparators 20 and 30 shown in FIG. 12. In this figure, the circuit 40 is comprised of only NAND gates. The output a is applied to a first input of a NAND gate 400. The output b is applied to a second input of the gate 400. The output b is also applied to first inputs of NAND gates 402 and 404. A NANDed output l of the gate 400 is inputted to first inputs of NAND gates 406 and 408. A second input of the gate 406 receives a NANDed output m of the gate 402. A NANDed output n of the gate 406 is inputted to a second input of the gate 402. The output n is level-inverted by an inverter 410. An inverted output o of the inverter 410 is applied to a second input of the gate 404. A NANDed output p of the gate 404 is inputted to a second input of the gate 408. The gate 408 produces a NANDed output e by NANDing of the outputs l and p. The output e is applied to the output buffer 12 in FIG. 4.

FIGS. 14A to 14I graphically illustrate the operation of the sense amplifier shown in FIGS. 12 and 13. Before time t70, the memory cell with the stored data of logic 0 is selected and the potential VS is at the minimum level. At time t70, when the memory cell of logic 1 is selected, the potential VS starts to rise. At time t72, when vs>VL holds (FIG. 14A), the signal b is logic 1 (FIG. 14C). At this time, the signal a is still logic 0 (FIG. 14B), and therefore a state l=logic 1 is still kept (FIG. 14D). Accordingly, a logic state n=logic 0 is kept because of a logic state of the signals m and l, m=l=logic 1 (FIGS. 14D to 14F). If n=logic 0, o=logic 1 (FIG. 14G). At time t72, since b=logic 1 and o=logic 1, p=logic 0 (FIGS. 14C, 14G and 14H). Because of p=logic 0, the output e becomes logic 1 (FIG. 14I).

At time t74, when VS>VH (FIG. 14A), a=logic 1 (FIG. 14B). Then, a=b=logic 1 and hance l=logic 0 (FIGS. 14B to 14D). As the result of l=logic 0, n=logic 1 and o=logic 0 (FIGS. 14F and 14G). Since b=n=logic 1, m=logic 0 (FIG. 14E). Since o=logic 0, p=logic 1 (FIG. 14H). Even if p=logic 1 at time t74, e=logic 1 is kept (FIG. 14I) since l=logic 0 at this time (FIG. 14D).

At time t80, when a memory cell with the stored data of logic 0 is selected, the potential VS starts to drop (FIG. 14A). At time t82, when VS<VH, a=logic 0 (FIG. 14B). The logic state a=logic 0 brings about l=logic 1 (FIG. 14D). A logic state l=p=logic 1 provides e=logic 0 (FIGS. 14D, 14H and 14I). At time t84, when VS<VL (FIG. 14A), b=logic 0 (FIG. 14C). The logic state b=logic 0 provides m=logic 1 (FIG. 14E). A relation l=m=logic 1 holds, so that n=logic 0 and o=logic 1 hold (FIGS. 14F and 14G). Even if o=logic 1, b=logic 0 is still held. Therefore, a relation p=logic 1 is kept (FIG. 14H). Accordingly, e=logic 0 is kept after time t84 (FIG. 14I).

Figure 15:
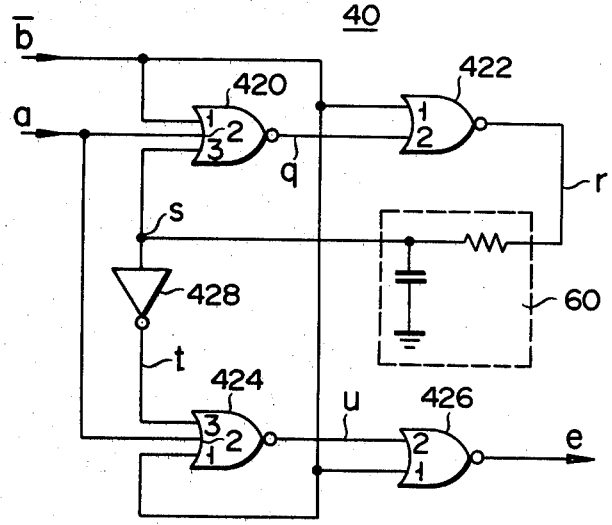
FIG. 15 illustrates a circuit arrangement of a modification of FIG. 13.

FIG. 15 shows a modification of the logic circuit shown in FIG. 13. All the gates in the modification are NOR gates. The inverted signal b̄ of the output b is inputted to first inputs of NOR gates 420 to 426. The output a is inputted to the second inputs of the gates 420 and 424. A NORed output q of the gate 420 is inputted to the second input of the gate 422. A NORed output r of the gate 422 is delayed by a delay circuit 60 to be a delayed output s. The output s is inputted to a third input of the gate 420 and an inverter 428. An inverted output t of the inverter 428 is inputted to a third input of the gate 424. A NORed output u of the gate 424 is inputted to a second input of the gate 426. A NORed output e of the gate 426 is applied to the output buffer 12 (FIG. 4).

FIGS. 16A to 16I illustrate the operation of the circuit of FIG. 15. Before time t90, a memory cell of logic 0 is selected. When at time t90 the memory cell of logic 1 is selected and at time t92 VS>VL holds, b=logic 0 (FIG. 16C). Then, a=b̄=s=logic 0 and hence q=logic 1 (FIG. 16D). A logic state that b̄=logic 0 and q=logic 0 continues for a delay time of the NOR gate 420 and a logic state that r=logic 1 takes place but instantaneously disappears, and then s=logic 0 is left. Therefore, r=s=logic 0 and t=logic 1 are kept even if b̄=logic 0 (FIGS. 16E to 16G). Further, because t=logic 1, u=logic 0 is kept (FIG. 16H).

At time t92, if b̄=logic 0 (FIG. 16C), e=logic 1 (FIG. 16I) since u=logic 0 (FIG. 16H).

At time t94, if VS>VH (FIG. 16A), a=logic 1 (FIG. 16B), and then q=logic 0 (FIG. 16D). At this time, since b̄=logic 0, r=logic 1 (FIG. 16E). When r=logic 1, the input potential s of the inverter 428 rises (FIG. 16F). At time t96, if the potential s exceeds the input threshold of the inverter 428, t=logic 0 (FIG. 16G).

At time t100, when a memory cell of logic 0 is selected, the potential VS starts to drop. At time t102, when VS<VH (FIG. 16A), a=logic 0 (FIG. 16B). At this time, b̄=t=logic 0, u=logic 1 holds (FIG. 16H). Since u=logic 1, e=logic 0 (FIG. 16I).

At time t104, when VS<VL (FIG. 16A), b̄=logic 1 (FIG. 16C), and then r=logic 0 (FIG. 16E). Because of r=logic 0, the potential s starts to drop. At time t106, when the potential s falls below the input threshold of the inverter 428, t=logic 1 (FIG. 16G), and u=logic 0 (FIG. 16H). Since b̄=logic 1 (FIG. 16C) even if u=logic 0, e=logic 0 is kept (FIG. 16I).

Figure 17:
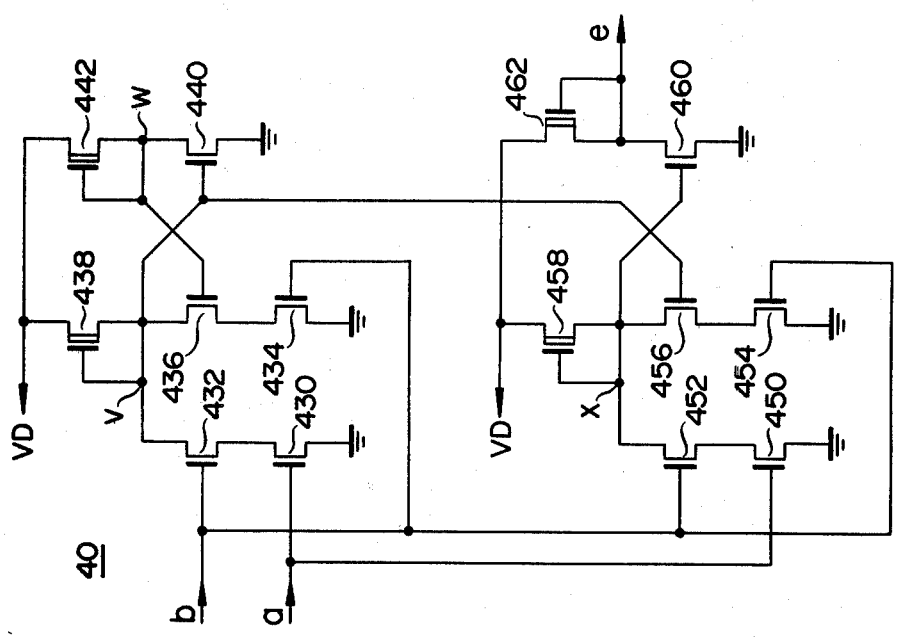
FIG. 17 illustrates a circuit arrangement of another modification of the logic circuit in FIG. 13.

FIG. 17 shows another modification of the logic circuit 40. The output a is inputted to gates of enhancement mode MOS transistors 430 and 450. The output b is inputted to gates of enhancement mode MOS transistors 432, 434, 452 and 454. Sources of the transistors 430, 434, 450 and 454 are grounded. Drains of the transistors 430 and 450 are connected with sources of the transistors 432 and 452, respectively. Drains of the transistors 434 and 454 are connected to sources of enhancement mode MOS transistors 436 and 456, respectively. Drains of the transistors 432 and 436 are connected to a gate and a source of a depletion mode MOS transistor 438, respectively. Drains of the transistors 452 and 456 are connected to a gate and a source of a depletion mode MOS transistor 458, respectively.

A source of the transistor 438 is connected with a gate of an enhancement mode MOS transistor 440 and a gate of the transistor 456. A source of the transistor 440 is grounded, and its drain is connected with a gate of the transistor 436. A drain of the transistor 440 is connected to a gate and a source of a depletion mode MOS transistor 442. Drains of the transistors 438 and 442 are connected with a positive supply voltage VD. A source of the transistor 458 is connected with a gate of an enhancement mode MOS transistor 460. A source of the transistor 460 is grounded, and its drain is connected to a gate and a source of a depletion mode MOS transistor 462. Drains of the transistor 458 and 462 are connected to the voltage VD. The output e is derived from the drain of the transistor 460.

FIGS. 18A to 18G graphically illustrate the operation of the circuit 40 shown in FIG. 17. At time t112, VS>VL (FIG. 18A) and b=logic 1 (FIG. 18C). At this time, v=logic 1 (FIG. 18D), so that transistors 454 and 456 are turned on and x=logic 0 (FIG. 18F). Then, the output e representing logic 1 of the stored data is produced (FIG. 18G).

At time t114, VS>VH and a logic state a=b=logic 1 causes the transistors 430 and 432 to be turned ON, so that v=logic 0 and w=logic 1 (FIGS. 18A to 18E).

When VS<VH at time t122 (FIG. 18A), a=logic 0 (FIG. 18B). At this time, b=logic 1 (FIG. 18C) but v=logic 0 (FIG. 18D). Therefore, transistors 450 and 456 are turned OFF. The result is that x=logic 1 and e=logic 0 (FIGS. 18F and 18G).

At time t124, when VS<VL, a=b=logic 0 and hence v=logic 1, and w=logic 0 (FIGS. 18A to 18E). After time t124, signal states similar to those before time t112 are presented.

Figure 19:
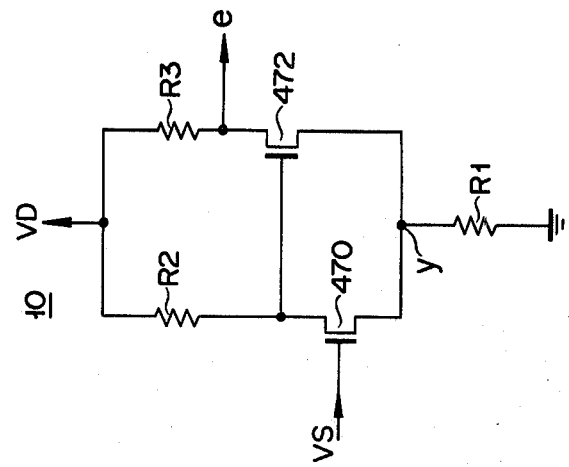
FIG. 19 illustrates a circuit arrangement of another embodiment of the sense amplifier shown in FIG. 4.

FIG. 19 shows another embodiment of the sense amplifier 10 shown in FIG. 4. The sense potential VS is inputted into a gate of an enhancement or depletion mode MOS transistor 470. A drain of the transistor 470 is connected to a gate of an enhancement mode MOS transistor 472. Sources of the transistors 470 and 472 are grounded through a resistor R1. Drains of the transistors 470 and 472 are connected to a positive supply voltge VD, through resistors R2 and R3. In the present embodiment, R2<R3.

The circuitry of FIG. 19 forms a hysteresis comparator with two threshold levels VH and VL. When e=logic 1, the transistor 470 is turned ON, while the transistor 472 is turned OFF. This indicates a state that the stored data of logic 1 is read out. A source potential y at this time is VD·R1/(R1+R2). This corresponds to a first threshold level VH. When VS<VH during the course of reading out the logic 0, the transistor 470 is turned OFF and the transistor 472 is turned ON. Then, e=logic 0. Simultaneously, the source potential y drops to VD·R1/(R1+R3). This dropped potential level corresponds to a second threshold level VL. When VS>VL holds during the course of reading out logic 1, the transistor 470 is ON and the transistor 472 is turned OFF, and e=logic 1 outputted. The threshold levels VH and VL in FIG. 19 can properly be changed in accordance with resistances of the resistors R1 to R3 and an input threshold level of the transistor 470. The resistor R1 may be coupled with a proper negative potential in place of ground.

It is to be understood that the present invention is not limited to the embodiments thus far described in any way. For example, the MOS transistors used may be of N channel, P channel or C-MOS type. When the P channel MOS transistors are used, the polarities of the potential are inverted for those of the N channel transistors. The selection of the channel type of the transistors used are within the scope of the invention. The transistors used are not limited to the MOS FETs. The present invention is applicable for sense amplifiers using bipolar transistors or the like, or level sensors such as CCD shift registers.

In the embodiments as mentioned above, for storing data 0 or 1, the drain of each MOS transistor as a memory cell may be electrically connected to or disconnected from the data line 2. Alternately, the data storage may be realized by raising or dropping the threshold voltage of the MOS transistor of the memory cell.

What is claimed is:

1. A memory device comprising:
   (a) memory cells containing stored data in a first or second state;
   (b) a data line coupled to said memory cells for transferring data stored in said memory cells;
   (c) decoder means coupled to said memory cells for selecting one of said memory cells to be coupled to said data line, the potential of said data line reflecting the state of the stored data of said selected memory cell; and
   (d) sensor means coupled to said data line and responsive to the data line potential, to a first threshold level and to a second threshold level below said first threshold level, said sensor means providing a read out output corresponding to the stored data of said selected memory cell such that when the data line potential exceeds said first threshold level, said sensor means provides a read out output representing said first state, and when the data line potential drops below said second threshold level, said sensor means provides a read out output representing said second state.

2. A memory device comprising:
   (a) memory cells containing stored data in a first or second state;
   (b) a data line coupled to said memory cells for transferring data stored in said memory cells;
   (c) decoder means coupled to said memory cells for selecting one of said memory cells to be coupled to said data line, the potential of said data line reflecting the state of the stored data of said selected memory cell;
   (d) first comparator means for comparing the data line potential with a first threshold level and generating a first comparison output when the data line potential exceeds the first threshold level;
   (e) second comparator means for comparing the data line potential with a second threshold level below said first threshold level and generating a second comparison output when the data line potential drops below the second threshold level; and
   (f) logic circuit means responsive to said first and second comparison outputs for providing a first stored data output according to the first comparison output and corresponding to said first state and providing a second stored data output according to the second comparison output and corresponding to said second state.

3. A memory device comprising:

(a) memory cells containing stored data in a first or second state;

(b) a first data line coupled to said memory cells for transferring data stored in said memory cells;

(c) decoder means coupled to said memory cells for selecting one of said memory cells to be coupled to said first data line, the potential of said first data line reflecting the state of the stored data of said selected memory cell;

(d) differential amplifier means having a first input which receives the first data line potential and a second input which receives a second data line potential having an antiphase relationship to said data line potential for providing a read out output according to the potential difference between said first data line potential and second data line potential;

(e) first sensitivity changer means coupled to the second input of said differential amplifier means and responsive to a first level corresponding to said data line potential for increasing the sensitivity of said second input; and (f) second sensitivity changer means coupled to the first input of said differential amplifier means and responsive to a second level corresponding to said second data line potential for increasing the sensitivity of said first input in which, when said first sensitivity changer means increases the second input sensitivity, said differential amplifier means provides a first stored data output corresponding to one logical state of said read out output, and when said second sensitivity changer means increases the first input sensitivity, said differential amplifier means provides a second stored data output corresponding to the other logical state of said read out output.

4. A memory device comprising:
(a) memory cells containing stored data in a first or second state;

(b) a data line coupled to said memory cells for transferring data stored in said memory cells;

(c) decoder means coupled to said memory cells for selecting one of said memory cells to be coupled to said data line, the potential of said data line reflecting the state of the stored data of said selected memory cell;

(d) first source means for providing a first threshold level;

(e) second source means for providing a second threshold level;

(f) comparator means responsive to the data line potential and one of said first and second threshold levels for providing a comparison result;

(g) delay means coupled to said comparator means and responsive to said comparison result for providing selection information indicating the disappearance of a potential change of said data line potential; and (h) gate means coupled to said first source means, said second source means, said comparator means and said delay means and responsive to said selection information for gating said first threshold level and said second threshold level such that, when the data line potential corresponds to a first stored data, said gate means conducts said second threshold level to said comparator means, and when the data line potential corresponds to a second stored data, said gate means conducts said first threshold level to said comparator means.

5. A memory device comprising:
(a) memory cells containing stored data in a first or second state;

(b) a data line coupled to said memory cells for transferring data stored in said memory cells;

(c) decoder means coupled to said memory cells for selecting one of said memory cells to be coupled to said data line, the potential of said data line reflecting the state of the stored data of said selected memory cell;

(d) first source means for providing a first threshold level;

(e) second source means for providing a second threshold level;

(f) comparator means responsive to the data line potential and one of said first and second threshold levels for providing a comparison result;

(g) delay means reponsive to said data line potential for providing selection information indicating the disappearance of a potential change of said data line potential; and (h) gate means coupled to said first source means, said second source means, said comparator means and said delay means and responsive to said selection information for gating said first threshold level and second threshold level such that, when the data line potential corresponds to a first stored data, said gate means conducts said second threshold level to said comparator means, and when the data line potential corresponds to a second stored data, said gate means conducts said first threshold level to said comparator means.

6. A memory device comprising:
(a) memory cells containing stored data in a first or second state;

(b) a data line stored in said memory cells for transferring data stored in said memory cells;

(c) decoder means coupled to said memory cells for selecting one of said memory cells to be coupled to said data line, the potential of said data line reflecting the state of the stored data of said selected memory cell;

(d) a first transistor whose gate receives the data line potential;

(e) a second transistor whose gate and source are respectively connected to the drain and source of said first transistor, and whose drain provides a read out output;

(f) first impedance means connected between the source of said first transistor and a first power supply potential;

(g) second impedance means connected between the drain of said first transistor and a second power supply potential; and (h) third impedance means connected between the drain of said second transistor and said second power supply potential, in which a source potential of said first transistor represents two potentials, one of which depends on the resistance ratio of said first and second impedance means and corresponds to a first threshold level, and the other of which depends on the resistance ratio of said first and third impedance means and corresponds to a second threshold level.

7. A memory device of claim 1, wherein said sensor means includes a differential amplifier having a first input which receives the data line potential and a second input which receives a second data line potential having an antiphase relationship to said first data line potential, said differential amplifier providing said read out output according to the potential difference between said first and second data line potentials.

8. A memory device of claim 1, wherein said sensor means includes a comparator responsive to said data line potential and one of said first and second threshold levels for providing a comparison result corresponding to said read out output.

9. A memory device comprising:
(a) memory cells containing stored data in a first or second state;
(b) a data line coupled to said memory cells for transferring data stored in said memory cells;
(c) decoder means coupled to said memory cells for selecting one of said memory cells to be coupled to said data line, the potential of said data line reflecting the state of the stored data of said selected memory cell; and
(d) sensor means coupled to said data line and responsive to the data line potential, for sensing the stored data of said selected memory cell from said data line potential, comparing said sensed stored data to a sense level and providing a read out output corresponding the sensed stored data, said sensor means including means responsive to the data stored in said selected memory cell for changing said sense level.

10. A memory device comprising:
(a) memory cells containing stored data in a first or second state;
(b) a data line coupled to said memory cells for transferring data stored in said memory cells;
(c) decoder means coupled to said memory cells for selecting one of said memory cells to be coupled to said data line, the potential of said data line reflecting the state of the stored data of said selected memory cell; and
(d) sensor means coupled to said data line and responsive to the data line potential, to a first threshold level, and to a second threshold level below said first threshold level, said sensor means including
  (i) a first comparator for comparing the data line potential with said first threshold level and generating a first comparison output when the data line potential exceeds said first threshold level,
  (ii) a second comparator for comparing of data line potential with said second threshold level and generating a second comparison output when the data line potential drops below said second threshold level, and
  (iii) a logic circuit responsive to said first and second comparison outputs for providing a first read out output according to said first comparison output and for providing a second read out output according to said second comparison output.

11. A memory device of claim 10, wherein said first comparator generates said first comparison output at the time when the data line potential falls below the first threshold level; and said second comparator generates said second comparison output at the time when the data line potential exceeds the second threshold level.

12. A memory cell comprising:
(a) memory cells containing stored data in a first or second state;
(b) a data line coupled to said memory cells for transferring data stored in said memory cells;
(c) decoder means coupled to said memory cells for selecting one of said memory cells to be coupled to said data line, the potential of said data line reflecting the state of the stored data of said selected memory cell; and
(d) sensor means coupled to said data line and responsive to the data line potential, to a first threshold level and to a second threshold level below said first threshold level, said sensor means providing a read out output corresponding to the stored data of said selected memory cell such that when the data line potential exceeds said first threshold level, said sensor means provides a read out output representing said first state, and when the data line potential drops below said second threshold level, said sensor means provides a read out output representing said second state, and said sensor means also including
  (i) a differential amplifier having a first input receiving said data line potential and a second input receiving a second data line potential which has an antiphase relationship to said data line potential, said differential amplifier providing said read out output,
  (ii) a first sensitivity changer coupled to said second input of said differential amplifier and responsive to a first level corresponding to said data line potential, said sensitivity changer increasing the sensitivity of said second input, and
  (iii) a second sensitivity changer coupled to said first input of said differential amplifier and responsive to a second level corresponding to a said second data line potential, said second sensitivity changer increasing the sensitivity of said first input such that when said first sensitivity changer increases the sensitivity of said second input, said differential amplifier provides a read out output representing said first state, and when said second sensitivity changer increases the sensitivity of said first input, said differential amplifier provides a read out output representing said second state.

13. A memory device of claim 12, wherein said sensor means further includes a delay circuit responsive to said data line potential for providing said first threshold level corresponding to a potential change point of said data line potential and being delayed by a given time so that the level change point of said first threshold level appears at the time when the corresponding potential change point of said data line potential disappears.

14. A memory device comprising:
(a) memory cells containing stored data in a first or second state;
(b) a data line coupled to said memory cells for transferring data stored in said memory cells;
(c) decoder means coupled to said memory cells for selecting one of said memory cells to be coupled to said data line, the potential of said data line reflecting the state of the stored data of said selecting memory cell; and (d) sensor means coupled to said data line and responsive to the data line potential, to a first threshold level and to a second threshold level below said first threshold level, said sensor means providing a read out output corresponding to the stored data of said selected memory cell such that when the data line potential exceeds said first threshold level, said sensor means provides a read out output representing said first state, and when the data line potential drops below said second threshold level, said sensor means provides a read out output representing said second state, said sensor means including (i) a first threshold level source for providing said first threshold level, (ii) a second threshold level source for providing said second threshold level, and (iii) a comparator responsive to said data line potential and to one of said first and second threshold levels for providing a comparison result corresponding to said read out output.

15. A memory device comprising:

(a) memory cells containing stored data in a first or second state;

(b) a data line coupled to said memory cells for transferring data stored in said memory cells;

(c) decoder means coupled to said memory cells for selecting one of said memory cells to be coupled to said data line, the potential of said data line reflecting the state of the stored data of said selected memory cell; and (d) sensor means coupled to said data line and responsive to the data line potential, to a first threshold level, and to a second threshold level below said first threshold level, said sensor means providing a read out output corresponding to the stored data of said selected memory cell such that when the data line potential exceeds said first threshold level, said sensor means provides a read out output representing said first state, and when the data line potential drops below said second threshold level, said sensor means provides a read out output representing said second state, said sensor means including (i) a comparator responsive to said data line potential and to one of said first and second threshold levels for providing a comparison result corresponding to said read out output, (ii) a delay circuit responsive to said data line potential for providing selection information indicating the disappearance of a change in said data line potential, and (iii) a gate circuit coupled to said comparator and to said delay circuit and responsive to said selection information for gating said first threshold level and said second threshold level such that when the data line potential corresponds to said second stored data, said gate circuit conducts said first threshold level to said comparator, and when the data line potential corresponds to said first stored data, said gate circuit conductor conducts said second threshold level to said comparator.

16. A memory device of claim 14, wherein said sensor means further includes a delay circuit coupled to said comparator and responsive to said comparison result for providing selection information indicating that a potential change point of said data line potential disappears; and a gate circuit coupled to said first threshold level source, said second threshold level source, said comparator and said delay circuit and responsive to said selection information for gating said first threshold level and second threshold level such that, when the data line potential corresponds to said second stored data, said gate circuit conducts said first threshold level to said comparator, and when the data line potential corresponds to said first stored data, said gate circuit conducts said second threshold level to said comparator.

17. A memory device of claim 16 or 15 wherein said sensor means further includes a timing circuit coupled to said comparator and delay circuit and responsive to said comparison result and said selection information, for providing a timing signal indicating a level change of said comparison result; and a latch circuit coupled to said timing circuit and comparator for latching the level of said comparison result according to said timing signal and providing the latched level as the read out output.

18. A memory device of claim 17, wherein said first threshold level corresponds to the maximum level of said data line potential, and said second threshold level corresponds to the maximum level of said data line potential.

19. A memory device comprising:

(a) memory cells containing stored data in a first or second state;

(b) a data line coupled to said memory cells for transferring data stored in said memory cells;

(c) decoder means coupled to said memory cells for selecting one of said memory cells to be coupled to said data line, the potential of said data line reflecting the state of the stored data of said selected memory cell; and (d) sensor means coupled to said data line and responsive to the data line potential, to a first threshold level, and to a second threshold level below said first threshold level, said sensor means providing a read out output corresponding to the stored data of said selected memory cell such that when the data line potential exceeds said first threshold level, said sensor means provides a read out output representing said first state, and when the data line potential drops below said second threshold level, said sensor means provides a read out output representing said second state, said sensor means including (i) a first transistor whose gate receives said data line potential, (ii) a second transistor whose gate and source are respectively connected to the drain and source of said first transistor, and whose drain provides said read out output, (iii) first impedance means connected between the source of said first transistor and a first power supply potential, (iv) second impedance means connected between the drain of said first transistor and a second power supply potential, and (v) third impedance means connected between the drain of said second transistor and said second power supply potential, such that a source potential of said first transistor represents two potentials, one of which depends on the resistance ratio of said first and second impedance means and corresponds to said first threshold level, and the other of which depends on the resistance ratio of said first and third impedance means and corresponds to said second threshold level.

20. A memory device of any one of claims 2, 4–6, 13, 16, 11, wherein said first threshold level corresponds to the maximum level of said data line potential, and said second threshold level corresponds to the minimum level of said data line potential.

* * * * *